United States Patent
Beaty et al.

(10) Patent No.: US 10,948,884 B2
(45) Date of Patent: Mar. 16, 2021

(54) BUILDING CONTROL BASED ON UNEVEN LOAD DISTRIBUTION

(71) Applicant: Johnson Controls Technology Company, Auburn Hills, MI (US)

(72) Inventors: Ryan C. Beaty, Milwaukee, WI (US); Graeme Willmott, West Milwaukee, WI (US); Matthew J. Asmus, Watertown, WI (US); Shawn A. Schlagenhaft, Fond du Lac, WI (US); Jared Fread, Milwaukee, WI (US)

(73) Assignee: Johnson Controls Technology Company, Auburn Hills, MI (US)

( * ) Notice: Subject to any disclaimer, the term of this patent is extended or adjusted under 35 U.S.C. 154(b) by 180 days.

(21) Appl. No.: 15/962,638

(22) Filed: Apr. 25, 2018

(65) Prior Publication Data
US 2019/0332072 A1    Oct. 31, 2019

(51) Int. Cl.
*G05B 13/04* (2006.01)
*G05D 23/19* (2006.01)
*G01R 21/133* (2006.01)

(52) U.S. Cl.
CPC ....... *G05B 13/048* (2013.01); *G01R 21/1338* (2013.01); *G05D 23/1917* (2013.01); *G05B 2219/2614* (2013.01)

(58) Field of Classification Search
CPC .............. G05B 13/048; G01R 21/1338; G05D 23/1917
USPC ........................................................ 700/276
See application file for complete search history.

(56) References Cited

U.S. PATENT DOCUMENTS

| | | | |
|---|---|---|---|
| 6,185,946 B1 * | 2/2001 | Hartman | F04D 15/029 62/175 |
| 9,002,532 B2 | 4/2015 | Asmus | |
| 9,696,054 B2 | 7/2017 | Asmus | |
| 2013/0345880 A1 * | 12/2013 | Asmus | G05D 23/1917 700/276 |
| 2015/0316902 A1 | 11/2015 | Wenzel et al. | |
| 2015/0316903 A1 | 11/2015 | Asmus et al. | |

OTHER PUBLICATIONS

Yu, F. W., and K. T. Chan. "Optimum load sharing strategy for multiple-chiller systems serving air-conditioned buildings." Building and environment 42.4 (2007): 1581-1593. (Year: 2007).*

(Continued)

*Primary Examiner* — Mohammad Ali
*Assistant Examiner* — Joshua T Sanders
(74) *Attorney, Agent, or Firm* — Foley & Lardner LLP

(57) ABSTRACT

Systems and methods for distributing load of an energy plant are disclosed herein. A target load of at least a first device and a second device of the energy plant is obtained. A first power consumption of the first device and the second device predicted to result from operating the first device and the second device according to a first combination of set points to satisfy the target load is predicted. A second power consumption of the first device and the second device predicted to result from operating the first device and the second device according to a second combination of set points to satisfy the target load is predicted. The first power consumption and the second power consumption are compared, and a combination of set points rendering lower power consumption is selected to operate the energy plant.

20 Claims, 12 Drawing Sheets

(56) References Cited

OTHER PUBLICATIONS

Chan, Kwok Tai, and Fu Wing Yu. "How chillers react to building loads." ASHRAE journal 46.8 (2004): 52-58 (Year: 2004).*
U.S. Appl. No. 62/537,811, filed Jul. 27, 2017, Willmott, et al.
U.S. Appl. No. 62/529,789, filed Jul. 7, 2017, Willmott, et al.
U.S. Appl. No. 62/537,739, filed Jul. 27, 2017, Willmott, et al.
U.S. Appl. No. 62/537,793, filed Jul. 27, 2017, Willmott, et al.
U.S. Appl. No. 62/662,103, filed Apr. 24, 2018, Willmott, et al.

* cited by examiner

FIG. 5B

550 →
552 Condenser
554 Valve
556 Evaporator
558 Compressor
560 Control Panel

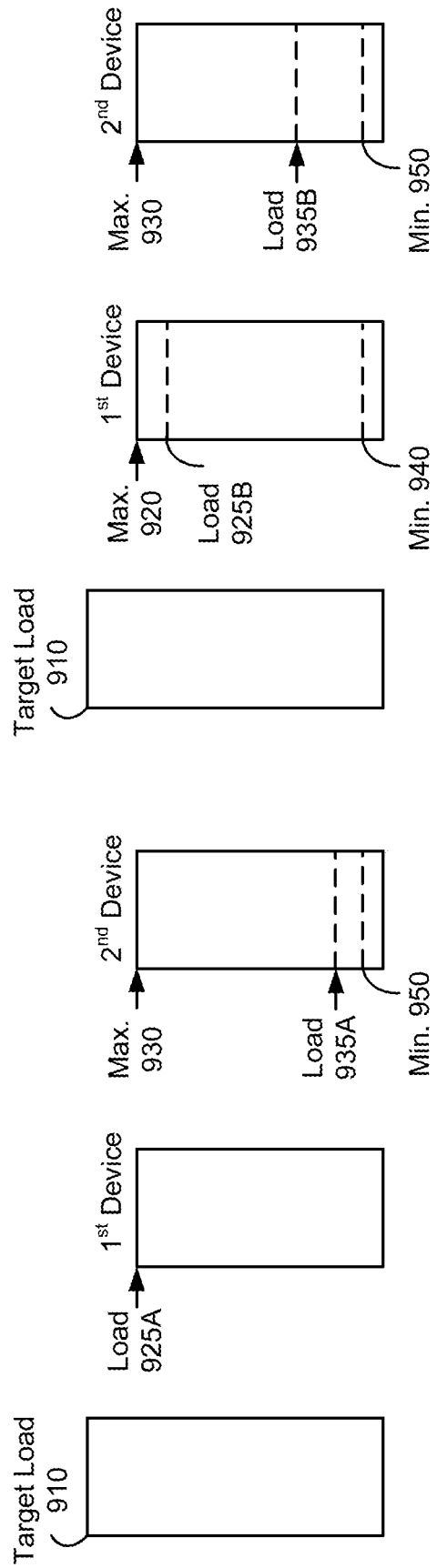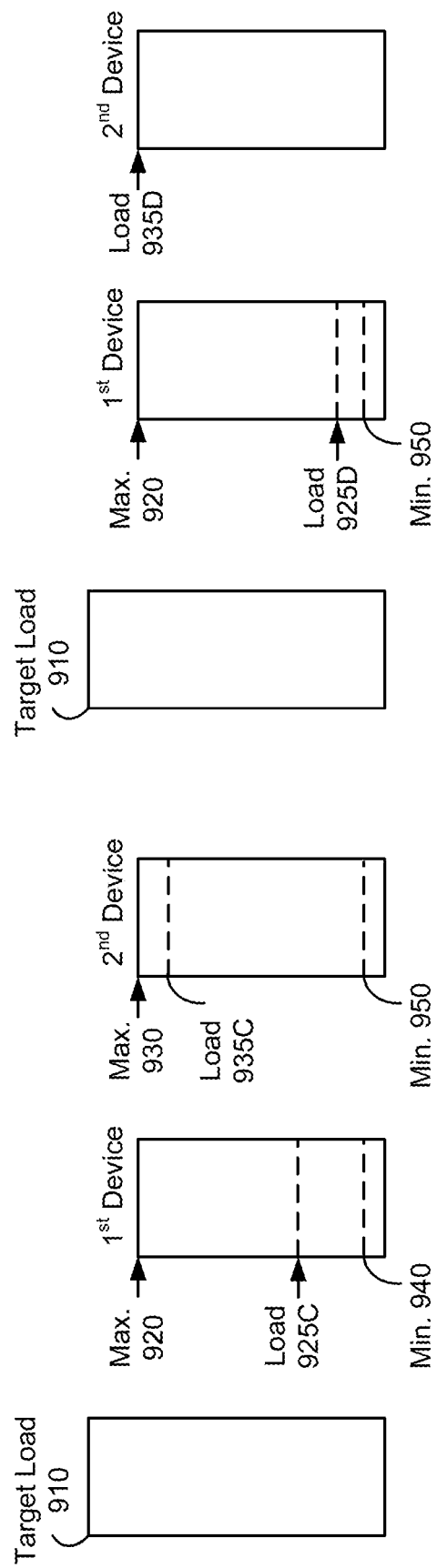

BUILDING CONTROL BASED ON UNEVEN LOAD DISTRIBUTION

BACKGROUND

The present disclosure relates generally to the operation of a central plant for serving building thermal energy loads. The present disclosure relates more particularly to systems and methods for distributing loads of subplants in a central plant.

A heating, ventilation and air conditioning (HVAC) system (also referred to as "a central plant" or "an energy plant" herein) may include various types of equipment configured to serve the thermal energy loads of a building or building campus. For example, a central plant may include HVAC devices such as heaters, chillers, heat recovery chillers, cooling towers, or other types of equipment configured to provide heating or cooling for the building. Some central plants include thermal energy storage configured to store the thermal energy produced by the central plant for later use.

A central plant may consume resources from a utility (e.g., electricity, water, natural gas, etc.) to heat or cool a working fluid (e.g., water, glycol, etc.) that is circulated to the building or stored for later use to provide heating or cooling for the building. Fluid conduits typically deliver the heated or chilled fluid to air handlers located on the rooftop of the building or to individual floors or zones of the building. The air handlers push air past heat exchangers (e.g., heating coils or cooling coils) through which the working fluid flows to provide heating or cooling for the air. The working fluid then returns to the central plant to receive further heating or cooling and the cycle continues.

Controlling the central plant includes distributing the thermal energy loads of HVAC devices, and operating the HVAC devices according to the distributed thermal energy loads. One approach of distributing thermal energy loads includes identifying HVAC devices in a common branch, and splitting thermal energy load evenly for the HVAC devices in the common branch. However, distributing the thermal energy load evenly may not render an efficient solution (e.g., power efficiency).

SUMMARY

One implementation of the present disclosure is a system to operate an energy plant. The system includes a processing circuit comprising a processor and memory storing instructions executed by the processor. The processing circuit is configured to obtain a target load of a branch of the energy plant. The branch includes at least a first device and a second device coupled to each other in parallel. The processing circuit is further configured to predict a first power consumption of the first device and the second device. The first power consumption is predicted to result from operating the first device and the second device according to a first combination of set points to satisfy the target load. The first combination of set points includes first set points of the first device and second set points of the second device. The processing circuit is further configured to predict a second power consumption of the first device and the second device. The second power consumption is predicted to result from operating the first device and the second device according to a second combination of set points to satisfy the target load. The second combination of set points includes third set points of the first device and fourth set points of the second device. The processing circuit is further configured to compare the first power consumption and the second power consumption. The processing circuit is further configured to select, one of the first combination of set points and the second combination of set points according to which combination of set points is predicted to result in lower power consumption based on the comparing. The processing circuit is further configured to operate the energy plant according to the selected one of the first combination of set points and the second combination of set points.

Another implementation of the present disclosure is a non-transitory computer readable medium storing instructions to operate an energy plant. The instructions, when executed by a processor, cause a processor to obtain a target load of a branch of the energy plant. The branch includes at least a first device and a second device coupled to each other in parallel. The instructions, when executed by the processor, cause the processor to predict a first power consumption of the first device and the second device. The first power consumption is predicted to result from operating the first device and the second device according to a first combination of set points to satisfy the target load. The first combination of set points includes first set points of the first device and second set points of the second device. The instructions, when executed by the processor, cause the processor to predict a second power consumption of the first device and the second device. The second power consumption is predicted to result from operating the first device and the second device according to a second combination of set points to satisfy the target load. The second combination of set points includes third set points of the first device and fourth set points of the second device. The instructions, when executed by the processor, cause the processor to compare the first power consumption and the second power consumption. The instructions, when executed by the processor, cause the processor to select, one of the first combination of set points and the second combination of set points according to which combination of set points is predicted to result in lower power consumption based on the comparing. The instructions, when executed by the processor, cause the processor to operate the energy plant according to the selected one of the first combination of set points and the second combination of set points.

BRIEF DESCRIPTION OF THE DRAWINGS

FIG. 5B is a schematic diagram of a chiller of FIG. 5A, according to some embodiments.

FIGS. 9A-9D are examples of distributing a target load between a first device and a second device, according to some embodiments.

DETAILED DESCRIPTION

Overview

Referring generally to the FIGURES, disclosed herein are systems and methods for distributing thermal energy loads of an energy plant, and operating the energy plant accordingly.

In some embodiments, a target load (e.g., thermal energy load) of at least a first device and a second device of the energy plant is obtained. A first power consumption of the first device and the second device predicted to result from operating the first device and the second device according to a first combination of set points to satisfy the target load is predicted. A first combination of set points includes first set points for operating the first device and second set points for operating the second device. A second power consumption of the first device and the second device predicted to result from operating the first device and the second device according to a second combination of set points to satisfy the target load is predicted. A second combination of set points includes third set points for operating the first device and fourth set points for operating the second device. The first power consumption and the second power consumption are compared, and a combination of set points rendering lower power consumption is selected to operate the energy plant.

In one embodiment, a first load of the first device operating according to the first set points may be different from a second load of the second device operating according to the second set points. A third load of the first device operating according to the third set points may be different from a fourth load of the second device operating according to the fourth set points.

In one approach, the first device may be enabled and the second device may be disabled, according to the selected one of the first combination of set points and the second combination of set points.

Advantageously, the central plant controller improves an operation efficiency of the HVAC system. In one aspect, the load may be distributed in a manner that optimizes a power efficiency, rather than evenly distributing the load among the first device and the second device. For example, distributing a larger amount of load to the first device than the second device may be more power efficient than evenly distributing a load to the first device and the second device.

Building and HVAC System

Figure 1:
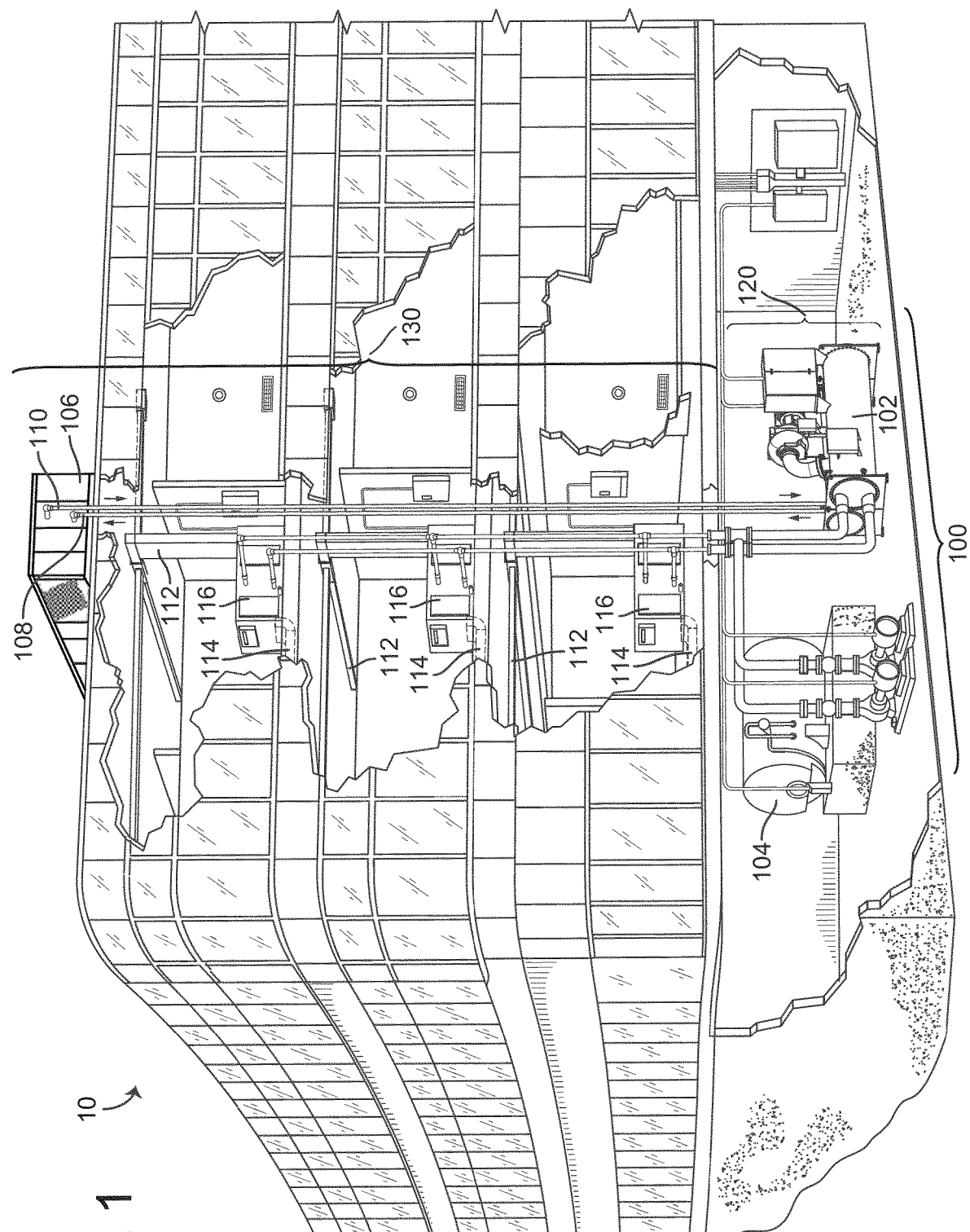
FIG. 1 is a drawing of a building equipped with an HVAC system, according to some embodiments.
Figure 2:
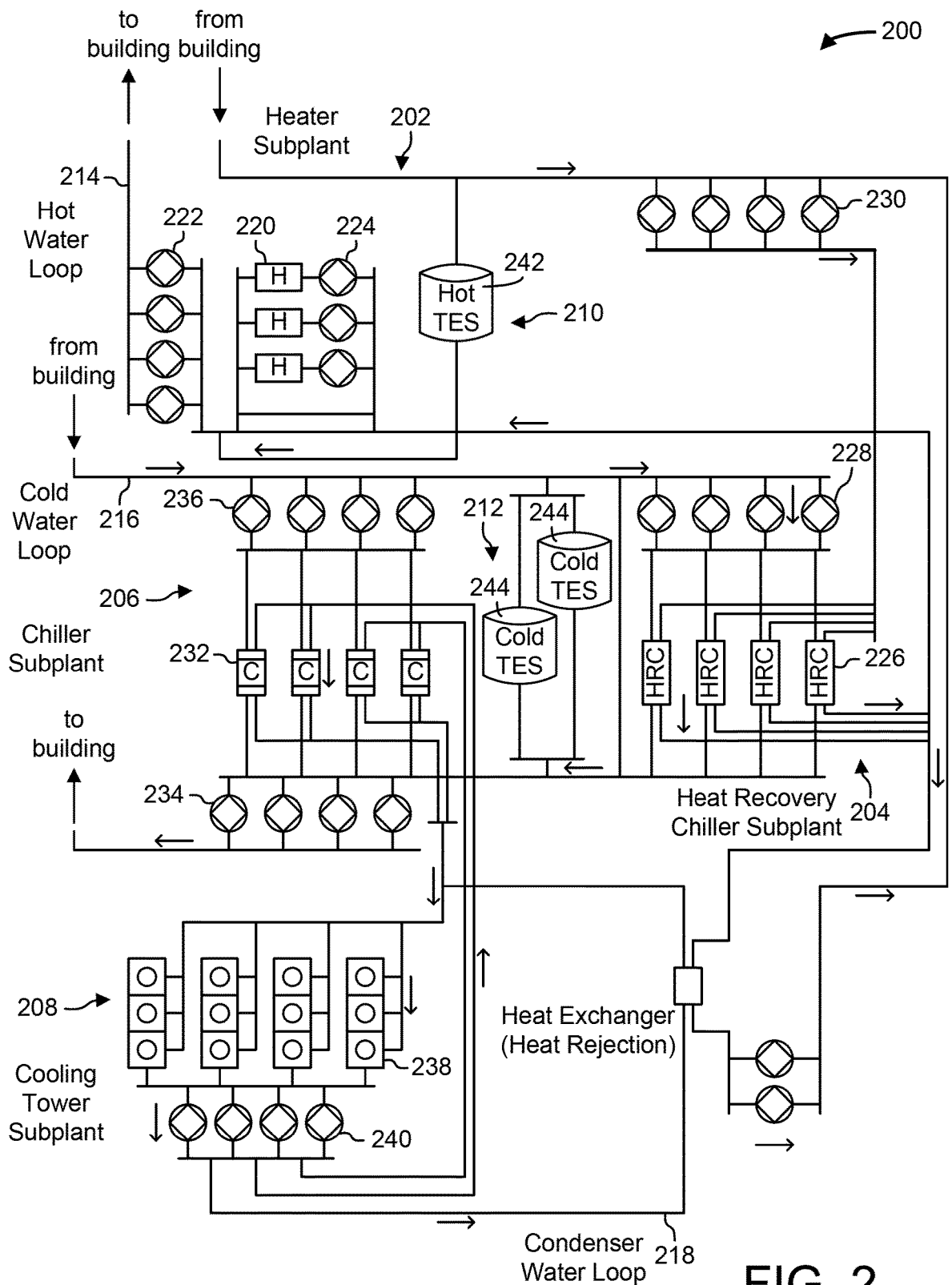
FIG. 2 is a schematic of a waterside system, which can be used as part of the HVAC system of FIG. 1, according to some embodiments.
Figure 3:
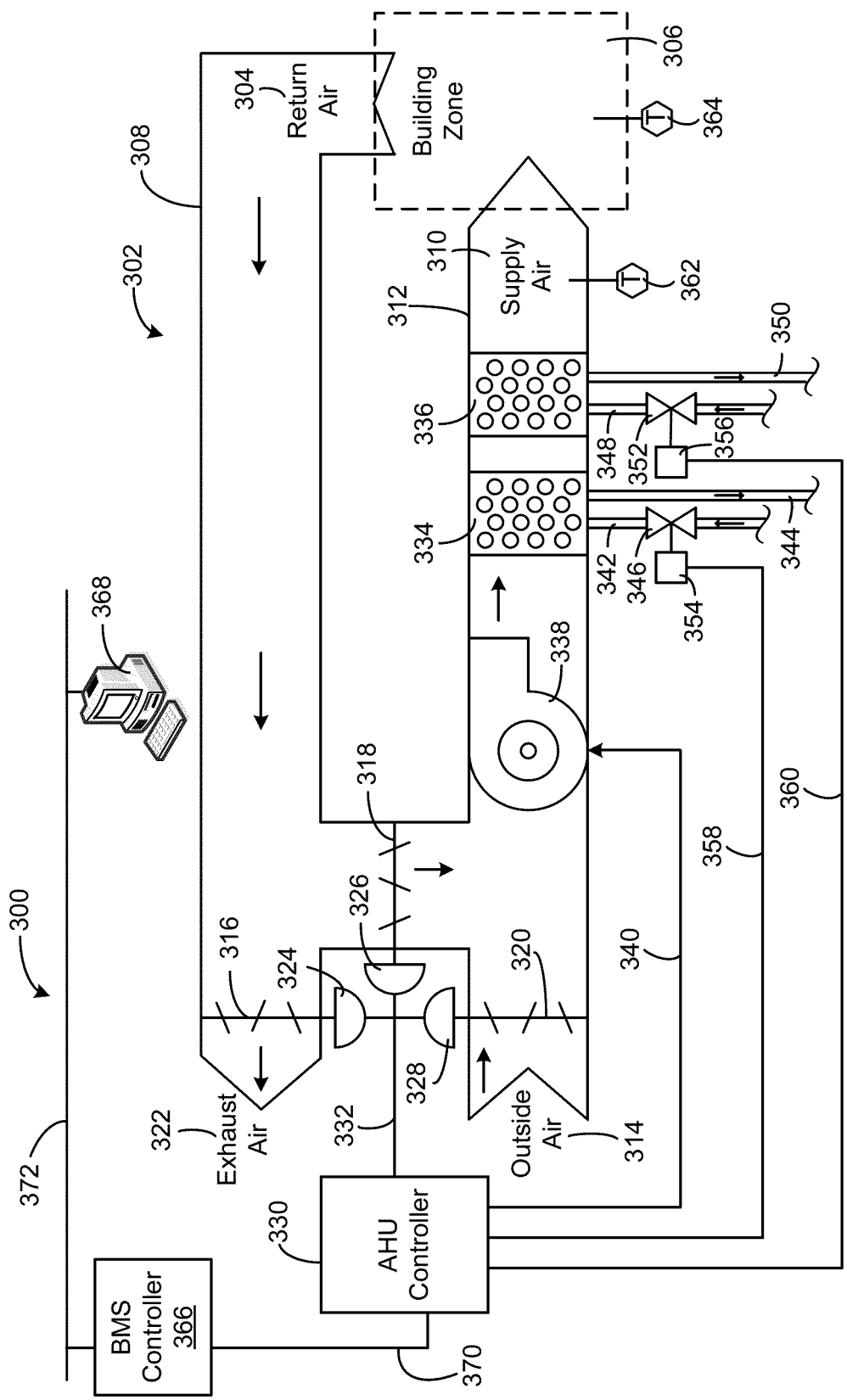
FIG. 3 is a block diagram illustrating an airside system, which can be used as part of the HVAC system of FIG. 1, according to some embodiments.

Referring now to FIGS. 1-3, an exemplary HVAC system in which the systems and methods of the present disclosure can be implemented are shown, according to an exemplary embodiment. While the systems and methods of the present disclosure are described primarily in the context of a building HVAC system, it should be understood that the control strategies described herein may be generally applicable to any type of control system.

Referring particularly to FIG. 1, a perspective view of a building 10 is shown. Building 10 is served by a building management system (BMS). A BMS is, in general, a system of devices configured to control, monitor, and manage equipment in or around a building or building area. A BMS can include, for example, an HVAC system, a security system, a lighting system, a fire alerting system, any other system that is capable of managing building functions or devices, or any combination thereof.

The BMS that serves building 10 includes an HVAC system 100. HVAC system 100 can include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 can provide a heated or chilled fluid to an air handling unit of airside system 130. Airside system 130 can use the heated or chilled fluid to heat or cool an airflow provided to building 10. An exemplary waterside system and airside system which can be used in HVAC system 100 are described in greater detail with reference to FIGS. 2-3.

HVAC system 100 is shown to include a chiller 102, a boiler 104, and a rooftop air handling unit (AHU) 106. Waterside system 120 can use boiler 104 and chiller 102 to heat or cool a working fluid (e.g., water, glycol, etc.) and can circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 can add heat to the circulated fluid, for example, by burning a combustible material (e.g., natural gas) or using an electric heating element. Chiller 102 can place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 can place the working fluid in a heat exchange relationship with an airflow passing through AHU 106 (e.g., via one or more stages of cooling coils and/or heating coils). The airflow can be, for example, outside air, return air from within building 10, or a combination of both. AHU 106 can transfer heat between the airflow and the working fluid to provide heating or cooling for the airflow. For example, AHU 106 can include one or more fans or blowers configured to pass the airflow over or through a heat exchanger containing the working fluid. The working fluid can then return to chiller 102 or boiler 104 via piping 110.

Airside system 130 can deliver the airflow supplied by AHU 106 (i.e., the supply airflow) to building 10 via air supply ducts 112 and can provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 can include various sensors (e.g., temperature sensors, pressure sensors, etc.) configured to measure attributes of the supply airflow. AHU 106 can receive input from sensors located within AHU 106 and/or within the building zone and can adjust the flow rate, temperature, or other attributes of the supply airflow through AHU 106 to achieve set-point conditions for the building zone.

Referring now to FIG. 2, a block diagram of a waterside system 200 is shown, according to an exemplary embodiment. In various embodiments, waterside system 200 can supplement or replace waterside system 120 in HVAC system 100 or can be implemented separate from HVAC system 100. When implemented in HVAC system 100, waterside system 200 can include a subset of the HVAC devices in HVAC system 100 (e.g., boiler 104, chiller 102, pumps, valves, etc.) and can operate to supply a heated or chilled fluid to AHU 106. The HVAC devices of waterside system 200 can be located within building 10 (e.g., as components of waterside system 120) or at an offsite location such as a central plant.

In FIG. 2, waterside system 200 is shown as a central plant having a plurality of subplants 202-212. Subplants 202-212 are shown to include a heater subplant 202, a heat recovery chiller subplant 204, a chiller subplant 206, a cooling tower subplant 208, a hot thermal energy storage (TES) subplant 210, and a cold thermal energy storage (TES) subplant 212. Subplants 202-212 consume resources (e.g., water, natural gas, electricity, etc.) from utilities to serve the thermal energy loads (e.g., hot water, cold water, heating, cooling, etc.) of a building or campus. For example, heater subplant 202 can be configured to heat water in a hot water loop 214 that circulates the hot water between heater subplant 202 and building 10. Chiller subplant 206 can be configured to chill water in a cold water loop 216 that circulates the cold water between chiller subplant 206 and the building 10. Heat recovery chiller subplant 204 can be configured to transfer heat from cold water loop 216 to hot water loop 214 to provide additional heating for the hot water and additional cooling for the cold water. Condenser water loop 218 can absorb heat from the cold water in chiller subplant 206 and reject the absorbed heat in cooling tower subplant 208 or transfer the absorbed heat to hot water loop 214. Hot TES subplant 210 and cold TES subplant 212 can store hot and cold thermal energy, respectively, for subsequent use.

Hot water loop 214 and cold water loop 216 can deliver the heated and/or chilled water to air handlers located on the rooftop of building 10 (e.g., AHU 106) or to individual floors or zones of building 10 (e.g., VAV units 116). The air handlers push air past heat exchangers (e.g., heating coils or cooling coils) through which the water flows to provide heating or cooling for the air. The heated or cooled air can be delivered to individual zones of building 10 to serve the thermal energy loads of building 10. The water then returns to subplants 202-212 to receive further heating or cooling.

Although subplants 202-212 are shown and described as heating and cooling water for circulation to a building, it is understood that any other type of working fluid (e.g., glycol, $CO_2$, etc.) can be used in place of or in addition to water to serve the thermal energy loads. In other embodiments, subplants 202-212 can provide heating and/or cooling directly to the building or campus without requiring an intermediate heat transfer fluid. These and other variations to waterside system 200 are within the teachings of the present invention.

Each of subplants 202-212 can include a variety of equipment's configured to facilitate the functions of the subplant. For example, heater subplant 202 is shown to include a plurality of heating elements 220 (e.g., boilers, electric heaters, etc.) configured to add heat to the hot water in hot water loop 214. Heater subplant 202 is also shown to include several pumps 222 and 224 configured to circulate the hot water in hot water loop 214 and to control the flow rate of the hot water through individual heating elements 220. Chiller subplant 206 is shown to include a plurality of chillers 232 configured to remove heat from the cold water in cold water loop 216. Chiller subplant 206 is also shown to include several pumps 234 and 236 configured to circulate the cold water in cold water loop 216 and to control the flow rate of the cold water through individual chillers 232.

Heat recovery chiller subplant 204 is shown to include a plurality of heat recovery heat exchangers 226 (e.g., refrigeration circuits) configured to transfer heat from cold water loop 216 to hot water loop 214. Heat recovery chiller subplant 204 is also shown to include several pumps 228 and 230 configured to circulate the hot water and/or cold water through heat recovery heat exchangers 226 and to control the flow rate of the water through individual heat recovery heat exchangers 226. Cooling tower subplant 208 is shown to include a plurality of cooling towers 238 configured to remove heat from the condenser water in condenser water loop 218. Cooling tower subplant 208 is also shown to include several pumps 240 configured to circulate the condenser water in condenser water loop 218 and to control the flow rate of the condenser water through individual cooling towers 238.

Hot TES subplant 210 is shown to include a hot TES tank 242 configured to store the hot water for later use. Hot TES subplant 210 can also include one or more pumps or valves configured to control the flow rate of the hot water into or out of hot TES tank 242. Cold TES subplant 212 is shown to include cold TES tanks 244 configured to store the cold water for later use. Cold TES subplant 212 can also include one or more pumps or valves configured to control the flow rate of the cold water into or out of cold TES tanks 244.

In some embodiments, one or more of the pumps in waterside system 200 (e.g., pumps 222, 224, 228, 230, 234, 236, and/or 240) or pipelines in waterside system 200 include an isolation valve associated therewith. Isolation valves can be integrated with the pumps or positioned upstream or downstream of the pumps to control the fluid flows in waterside system 200. In various embodiments, waterside system 200 can include more, fewer, or different types of devices and/or subplants based on the particular configuration of waterside system 200 and the types of loads served by waterside system 200.

Referring now to FIG. 3, a block diagram of an airside system 300 is shown, according to an exemplary embodiment. In various embodiments, airside system 300 can supplement or replace airside system 130 in HVAC system 100 or can be implemented separate from HVAC system 100. When implemented in HVAC system 100, airside system 300 can include a subset of the HVAC devices in HVAC system 100 (e.g., AHU 106, VAV units 116, ducts 112-114, fans, dampers, etc.) and can be located in or around building 10. Airside system 300 can operate to heat or cool an airflow provided to building 10 using a heated or chilled fluid provided by waterside system 200.

In FIG. 3, airside system 300 is shown to include an economizer-type air handling unit (AHU) 302. Economizer-type AHUs vary the amount of outside air and return air used by the air handling unit for heating or cooling. For example, AHU 302 can receive return air 304 from building zone 306 via return air duct 308 and can deliver supply air 310 to building zone 306 via supply air duct 312. In some embodiments, AHU 302 is a rooftop unit located on the roof of building 10 (e.g., AHU 106 as shown in FIG. 1) or otherwise positioned to receive return air 304 and outside air 314. AHU 302 can be configured to operate an exhaust air damper 316, mixing damper 318, and outside air damper 320 to control an amount of outside air 314 and return air 304 that combine to form supply air 310. Any return air 304 that does not pass through mixing damper 318 can be exhausted from AHU 302 through exhaust air damper 316 as exhaust air 322.

Each of dampers 316-320 can be operated by an actuator. For example, exhaust air damper 316 can be operated by actuator 324, mixing damper 318 can be operated by actuator 326, and outside air damper 320 can be operated by actuator 328. Actuators 324-328 can communicate with an AHU controller 330 via a communications link 332. Actuators 324-328 can receive control signals from AHU controller 330 and can provide feedback signals to AHU controller 330. Feedback signals can include, for example, an indication of a current actuator or damper position, an amount of torque or force exerted by the actuator, diagnostic information (e.g., results of diagnostic tests performed by actuators 324-328), status information, commissioning information, configuration settings, calibration data, and/or other types of information or data that can be collected, stored, or used by actuators 324-328. AHU controller 330 can be an economizer controller configured to use one or more control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control actuators 324-328.

Still referring to FIG. 3, AHU 302 is shown to include a cooling coil 334, a heating coil 336, and a fan 338 positioned within supply air duct 312. Fan 338 can be configured to force supply air 310 through cooling coil 334 and/or heating coil 336 and provide supply air 310 to building zone 306. AHU controller 330 can communicate with fan 338 via communications link 340 to control a flow rate of supply air 310. In some embodiments, AHU controller 330 controls an amount of heating or cooling applied to supply air 310 by modulating a speed of fan 338.

Cooling coil 334 can receive a chilled fluid from waterside system 200 (e.g., from cold water loop 216) via piping 342 and can return the chilled fluid to waterside system 200 via piping 344. Valve 346 can be positioned along piping 342 or piping 344 to control a flow rate of the chilled fluid through cooling coil 334. In some embodiments, cooling coil 334 includes multiple stages of cooling coils that can be independently activated and deactivated (e.g., by AHU controller 330, by BMS controller 366, etc.) to modulate an amount of cooling applied to supply air 310.

Heating coil 336 can receive a heated fluid from waterside system 200 (e.g., from hot water loop 214) via piping 348 and can return the heated fluid to waterside system 200 via piping 350. Valve 352 can be positioned along piping 348 or piping 350 to control a flow rate of the heated fluid through heating coil 336. In some embodiments, heating coil 336 includes multiple stages of heating coils that can be independently activated and deactivated (e.g., by AHU controller 330, BMS controller 366, etc.) to modulate an amount of heating applied to supply air 310.

Each of valves 346 and 352 can be controlled by an actuator. For example, valve 346 can be controlled by actuator 354 and valve 352 can be controlled by actuator 356. Actuators 354-356 can communicate with AHU controller 330 via communications links 358-360. Actuators 354-356 can receive control signals from AHU controller 330 and can provide feedback signals to AHU controller 330. In some embodiments, AHU controller 330 receives a measurement of the supply air temperature from a temperature sensor 362 positioned in supply air duct 312 (e.g., downstream of cooling coil 334 and/or heating coil 336). AHU controller 330 can also receive a measurement of the temperature of building zone 306 from a temperature sensor 364 located in building zone 306.

In some embodiments, AHU controller 330 operates valves 346 and 352 via actuators 354-356 to modulate an amount of heating or cooling provided to supply air 310 (e.g., to achieve a set-point temperature for supply air 310 or to maintain the temperature of supply air 310 within a set-point temperature range). The positions of valves 346 and 352 affect the amount of heating or cooling provided to supply air 310 by heating coil 336 or cooling coil 334 and may correlate with the amount of energy consumed to achieve a desired supply air temperature. AHU controller 330 can control the temperature of supply air 310 and/or building zone 306 by activating or deactivating coils 334-336, adjusting a speed of fan 338, or a combination thereof.

Still referring to FIG. 3, airside system 300 is shown to include a BMS controller 366 and a client device 368. BMS controller 366 can include one or more computer systems (e.g., servers, supervisory controllers, subsystem controllers, etc.) that serve as system level controllers, application or data servers, head nodes, or master controllers for airside system 300, waterside system 200, HVAC system 100, and/or other controllable systems that serve building 10. BMS controller 366 can communicate with multiple downstream building systems or subsystems (e.g., HVAC system 100, a security system, a lighting system, waterside system 200, etc.) via a communications link 370 according to like or disparate protocols (e.g., LON, BACnet, etc.). In various embodiments, AHU controller 330 and BMS controller 366 can be separate (as shown in FIG. 3) or integrated. The AHU controller 330 may be a hardware module, a software module configured for execution by a processor of BMS controller 366, or both.

In some embodiments, AHU controller 330 receives information (e.g., commands, set points, operating boundaries, etc.) from BMS controller 366 and provides information (e.g., temperature measurements, valve or actuator positions, operating statuses, diagnostics, etc.) to BMS controller 366. For example, AHU controller 330 can provide BMS controller 366 with temperature measurements from temperature sensors 362-364, equipment on/off states, equipment operating capacities, and/or any other information that can be used by BMS controller 366 to monitor or control a variable state or condition within building zone 306.

Client device 368 can include one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with HVAC system 100, its subsystems, and/or devices. Client device 368 can be a computer workstation, a client terminal, a remote or local interface, or any other type of user interface device. Client device 368 can be a stationary terminal or a mobile device. For example, client device 368 can be a desktop computer, a computer server with a user interface, a laptop computer, a tablet, a smartphone, a PDA, or any other type of mobile or non-mobile device. Client device 368 can communicate with BMS controller 366 and/or AHU controller 330 via communications link 372.

Example Climate Control System

Figure 4:
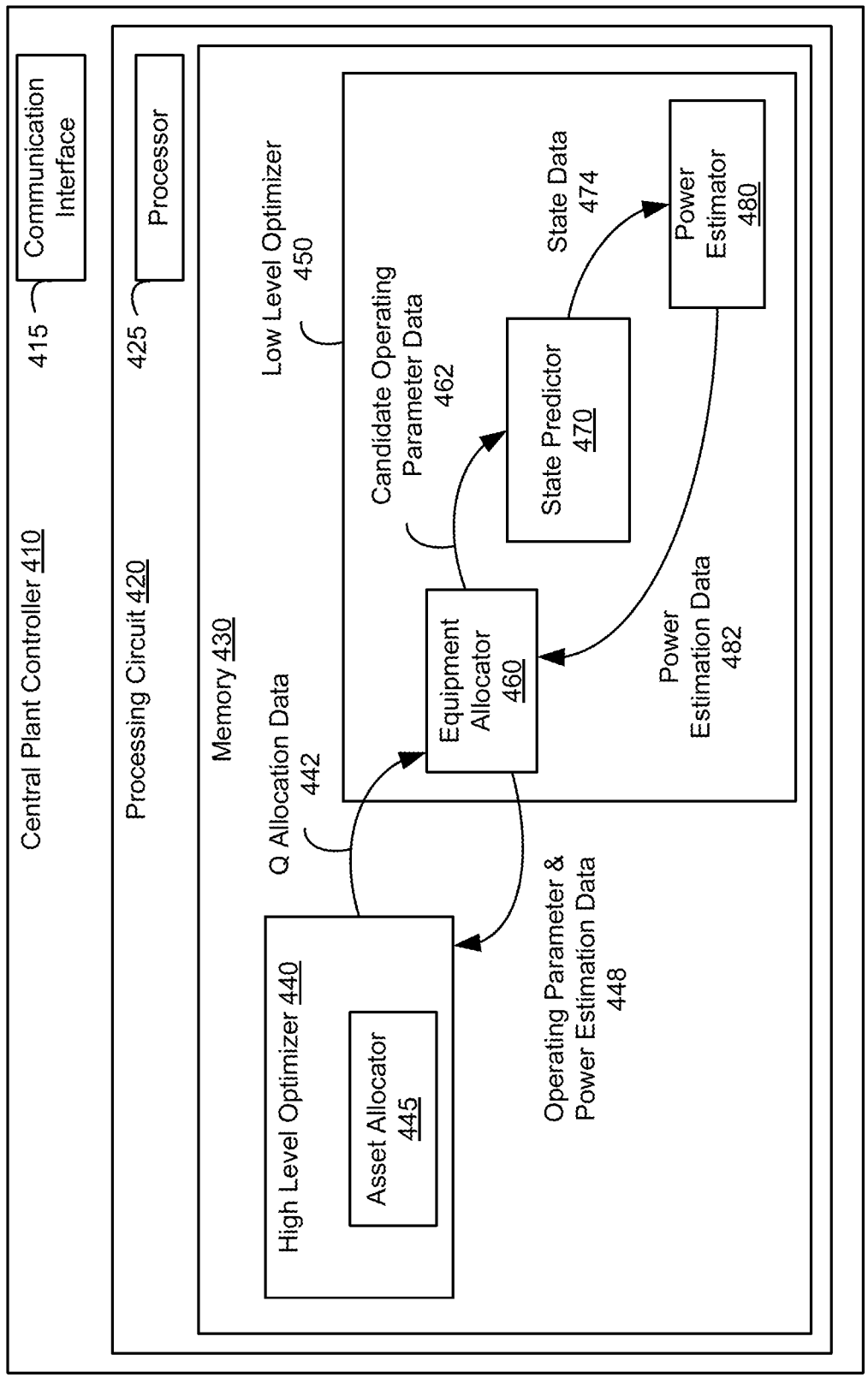
FIG. 4 is a block diagram of a central plant controller, according to some embodiments.

Referring to FIG. 4, illustrated is a block diagram of a central plant controller 410, according to some embodiments. In some embodiments, the central plant controller 410 is part of the HVAC system 100 of FIG. 1. Alternatively, the central plant controller 410 is coupled to the HVAC system 100 through a communication link. The central plant controller 410 may be the AHU controller 330 of FIG. 3, or a combination of the BMS controller 366 and the AHU controller 330 of FIG. 3. In one configuration, the central plant controller 410 includes a communication interface 415, and a processing circuit 420. These components operate together to determine a set of operating parameters for operating various HVAC devices of the HVAC system 100. In some embodiments, the central plant controller 410 includes additional, fewer, or different components than shown in FIG. 4.

The communication interface 415 facilitates communication of the central plant controller 410 with other HVAC devices (e.g., heaters, chillers, air handling units, pumps, fans, thermal energy storage, etc.). The communication interface 415 can be or include wired or wireless communications interfaces (e.g., jacks, antennas, transmitters, receivers, transceivers, wire terminals, etc.). In various embodiments, communications via the communication interface 415 can be direct (e.g., local wired or wireless communications) or via a communications network (e.g., a WAN, the Internet, a cellular network, etc.). For example, the communication interface 415 can include an Ethernet/USB/RS232/RS485 card and port for sending and receiving data through a network. In another example, the communication interface 415 can include a Wi-Fi transceiver for communicating via a wireless communications network. In another example, the communication interface 415 can include cellular or mobile phone communication transceivers.

The processing circuit 420 is a hardware circuit executing instructions to determine a set of parameters for operating HVAC devices of the HVAC system 100. In one embodiment, the processing circuit 420 includes a processor 425, and memory 430 storing instructions (or program code) executable by the processor 425. The memory 430 may be any non-transitory computer readable medium. In one embodiment, the instructions executed by the processor 425 cause the processor 425 to form software modules including a high level optimizer 440, and a low level optimizer 450. The high level optimizer 440 may determine how to distribute thermal energy loads across HVAC devices (e.g., subplants, chillers, heaters, valves, etc.) or branches of HVAC devices for each time step in the prediction window, for example, to minimize the cost of energy consumed by the HVAC devices. The low level optimizer 450 may determine how to operate each subplant according to the thermal energy loads determined by the high level optimizer 440. In other embodiments, the processor 425 and the memory 430 may be omitted, and the high level optimizer 440 and the low level optimizer 450 may be implemented as hardware modules by a reconfigurable circuit (e.g., field programmable gate array (FPGA)), an application specific integrated circuit (ASIC), or any circuitries, or a combination of software modules and hardware modules.

In one implementation, the high level optimizer 440 determines thermal energy loads of HVAC devices of the HVAC system 100, and generates Q allocation data 442 indicating the determined thermal energy loads. The high level optimizer 440 may provide the Q allocation data 442 to the low level optimizer 450. In return, the high level optimizer 440 may receive, from the low level optimizer 450, operating parameter and power estimation data 448 indicating a set of operating parameters to operate HVAC devices of the HVAC system 100, predicted power consumptions when operating the HVAC system 100 according to the set of operating parameters, or both. Based on the operating parameter and power estimation data 448, the high level optimizer 440 can operate the HVAC system 100 accordingly or generate different Q allocation data 442 for further optimization. The high level optimizer 440 and the low level optimizer 450 may operate together online in real time, or offline at different times.

In one or more embodiments, the high level optimizer 440 includes an asset allocator 445 that determines a distribution of thermal energy loads of the HVAC devices of the HVAC system 100 based on a predicted thermal energy load of the HVAC system 100. In some embodiments, the asset allocator 445 determines the optimal load distribution by minimizing the total operating cost of HVAC system 100 over the prediction time window. In one aspect, given a predicted thermal energy load $\hat{l}_k$ and utility rate information received through a user input or automatically determined by a scheduler (not shown), the asset allocator 445 may determine a distribution of the predicted thermal energy load $\hat{l}_k$ across subplants to minimize the cost. The asset allocator 445 generates the Q allocation data 442 indicating the predicted loads $\hat{l}_k$ of different HVAC devices of the HVAC system 100 and provides the Q allocation data 442 to the low level optimizer 450.

In some embodiments, distributing thermal energy load includes causing TES subplants to store thermal energy during a first time step for use during a later time step. Thermal energy storage may advantageously allow thermal energy to be produced and stored during a first time period when energy prices are relatively low and subsequently retrieved and used during a second time period when energy costs are relatively high. The high level optimization may be different from the low level optimization in that the high level optimization has a longer time constant due to the thermal energy storage provided by TES subplants. The high level optimization may be described by the following equation:

$$\theta_{HL}^* = \arg\min_{\theta_{HL}} J_{HL}(\theta_{HL}) \qquad \text{Eq. (1)}$$

where $\theta_{HL}^*$ contains the optimal high level decisions (e.g., the optimal load $\dot{Q}$ for each of subplants) for the entire prediction period and $J_{HL}$ is the high level cost function.

To find the optimal high level decisions $\theta_{HL}^*$, the asset allocator 445 may minimize the high level cost function $J_{HL}$. The high level cost function $J_{HL}$ may be the sum of the economic costs of each utility consumed by each of subplants for the duration of the prediction time period. For example, the high level cost function $J_{HL}$ may be described using the following equation:

$$J_{HL}(\theta_{HL}) = \sum_{k=1}^{n_h} \sum_{i=1}^{n_s} [\sum_{j=1}^{n_u} t_s \cdot c_{jk} u_{jik}(\theta_{HL})] \qquad \text{Eq. (2)}$$

where $n_h$ is the number of time steps k in the prediction time period, $n_s$ is the number of subplants, $t_s$ is the duration of a time step, $c_{jk}$ is the economic cost of utility j at a time step k of the prediction period, and $u_{jik}$ is the rate of use of utility j by subplant i at time step k. In some embodiments, the cost function $J_{HL}$ includes an additional demand charge term such as:

$$w_d c_{demand} \max_{n_h}(u_{elec}(\theta_{HL}), u_{max,ele}) \qquad \text{Eq. (3)}$$

where $w_d$ is a weighting term, $c_{demand}$ is the demand cost, and the max( ) term selects the peak electricity use during the applicable demand charge period.

In some embodiments, the high level optimization performed by the high level optimizer 440 is the same or similar to the high level optimization process described in U.S.

patent application Ser. No. 14/634,609 filed Feb. 27, 2015 and titled "High Level Central Plant Optimization," which is incorporated by reference herein.

The low level optimizer 450 receives the Q allocation data 442 from the high level optimizer 440, and determines operating parameters (e.g., capacities) of the HVAC devices of the HVAC system 100. In one or more embodiments, the low level optimizer 450 includes an equipment allocator 460, a state predictor 470, and a power estimator 480. These components operate together to determine a set of operating parameters, for example, rendering reduced power consumption of the HVAC system 100 for a given set of thermal energy loads indicated by the Q allocation data 442, and generate operating parameter data indicating the determined set of operating parameters. Particularly, the low level optimizer 450 determines the set of operating parameters based on schematic representations of HVAC devices of the HVAC system 100. In some embodiments, the low level optimizer 450 includes different, more, or fewer components, or includes components in different arrangements than shown in FIG. 4.

In one configuration, the equipment allocator 460 receives the Q allocation data 442 from the high level optimizer 440, and generates candidate operating parameter data 462 indicating a set of candidate operating parameters of HVAC devices of the HVAC system 100. The state predictor 470 receives the candidate operating parameter data 462 and predicts thermodynamic states of the HVAC system 100 at various locations for the set of candidate operating parameters. The state predictor 470 generates state data 474 indicating the predicted thermodynamic states, and provides the state data 474 to the power estimator 480. The power estimator 480 predicts, based on the state data 474, total power consumed by the HVAC system 100 operating according to the set of candidate operating parameters, and generates the power estimation data 482 indicating the predicted power consumption. The equipment allocator 460 may repeat the process with different sets of candidate operating parameters to obtain predicted power consumptions of the HVAC system 100 operating according to different sets of candidate operating parameters, and select a set of operating parameters rendering lower power consumption. The equipment allocator 460 may generate the operating parameter and power estimation data 448 indicating (i) the selected set of operating parameters and (ii) predicted power consumption of the power plant when operating according to the selected set of operating parameters, and provide the operating parameter and power estimation data 448 to the high level optimizer 440.

The equipment allocator 460 is a component that interfaces with the high level optimizer 440. In one aspect, the equipment allocator 460 receives the Q allocation data, and determines a candidate set of operating parameters of HVAC devices of the HVAC system 100. For example, the equipment allocator 460 determines that a first chiller is assigned to operate with a first range of thermal energy load and a second chiller is assigned to operate with a second range of thermal energy load based on the Q allocation data. In this example, the equipment allocator 460 may determine that operating parameters (e.g., between 30% to 50% capacity) of the first chiller can achieve the first range of thermal energy load and operating parameters (e.g., between 60~65% capacity) of the second chiller can achieve the second range of thermal energy load. From different combinations of operating parameters of the first chiller and the second chiller, the equipment allocator 460 selects a candidate set of operating parameters (e.g., 45% capacity of the first chiller and 60% capacity of the second chiller). Additionally, the equipment allocator 460 generates the candidate operating parameter data 462 indicating the selected candidate set of operating parameters, and provides the candidate operating parameter data 462 to the state predictor 470.

The state predictor 470 predicts an operating condition of the HVAC system 100 based on a set of operating parameters of the HVAC system 100 as indicated by the candidate operating parameter data 462. The operating condition of the HVAC system 100 includes thermodynamic states at various locations of the HVAC system 100. Examples of thermodynamic states include input pressure value, output pressure value, input mass flow value, output mass flow value, input enthalpy value, output enthalpy value, etc. In one approach, predicting thermodynamic states of the HVAC system 100 includes applying the set of operating parameters to a linear solver and a non-linear solver. Generally, the non-linear solver consumes a large amount of resources (e.g., processor threads and storage capacity) to obtain a solution. In one or more embodiments, the state predictor 470 reduces a number of unknown thermodynamic states to be predicted based on schematic arrangements of HVAC devices of the HVAC system 100, and may further reduce the number of unknown thermodynamic states to be predicted by propagating known thermodynamic states based on the operating parameters using the linear solver. Advantageously, a fewer number of unknown thermodynamic states can be determined by the non-linear solver, thereby improving efficiency of predicting the thermodynamic states for the set of operating parameters. The state predictor 470 generates state data 474 indicating the predicted thermodynamic states for the candidate set of operating parameters, and provides the state data 474 to the power estimator 480.

The power estimator 480 predicts power consumed by the HVAC system 100 based on the state data 474. In one approach, the power estimator 480 determines, for each HVAC device, a predicted power consumption based on thermodynamic states (e.g., pressure values, mass flow values, enthalpy values, etc.) and an operating parameter (e.g., capacity) of the HVAC device. In addition, the power estimator 480 may add power consumptions of the HVAC devices of the HVAC system 100 to obtain a total power consumption of the HVAC system 100. The power estimator 480 generates the power estimation data 482 indicating the total power consumption of the HVAC system 100, power consumption of each HVAC device, or any combination of them, and provides the power estimation data 482 to the equipment allocator 460.

In some embodiments, the equipment allocator 460 compares predicted power consumptions of the HVAC system 100 for multiple sets of operating parameters, and selects a set of operating parameters for operating the HVAC system 100. In one approach, the equipment allocator 460 selects, from the multiple sets of operating parameters, the set of operating parameters rendering the lowest power consumption. Hence, the HVAC system 100 operating based on the set of operating parameters determined by the equipment allocator 460 benefits from reduced power consumption. The equipment allocator 460 may generate the operating parameter and power estimation data 448 indicating the set of operating parameters to operate HVAC devices of the HVAC system 100, predicted power consumptions when operating the HVAC system 100 according to the set of operating parameters, or any combination of them, and provide the operating parameter and power estimation data 448 to the high level optimizer 440.

Figure 5A:
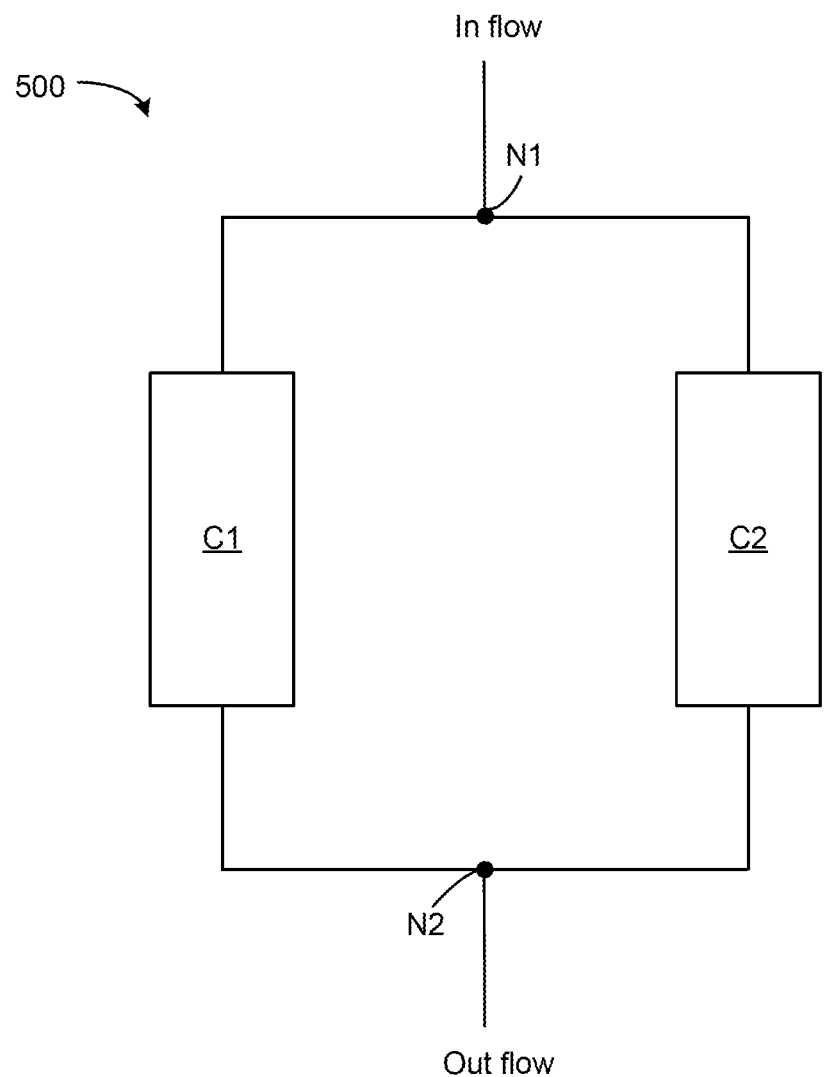
FIG. 5A is a schematic representation of a branch of an HVAC system, according to some embodiments.

Referring to FIG. 5A, illustrated is an example schematic representation of a branch 500 of an HVAC system, according to some embodiments. In the example shown in FIG. 5A, the example schematic representation includes chillers C1, C2 in parallel. In this example, the water pump P1 is coupled between nodes N1, N2. The chillers C1, C2 may be identical chillers. Alternatively, chillers C1, C2 are different chillers (e.g., electric chiller and steam chiller). In other examples, different components instead of chillers may be included in a branch. Although two chillers C1, C2 are shown in FIG. 5A, additional components may be added in a branch 500 of an HVAC system. Additionally or alternatively, the components of a branch 500 of HVAC system may be connected in different arrangements (e.g., series) than shown in FIG. 5A.

Figure 5B:
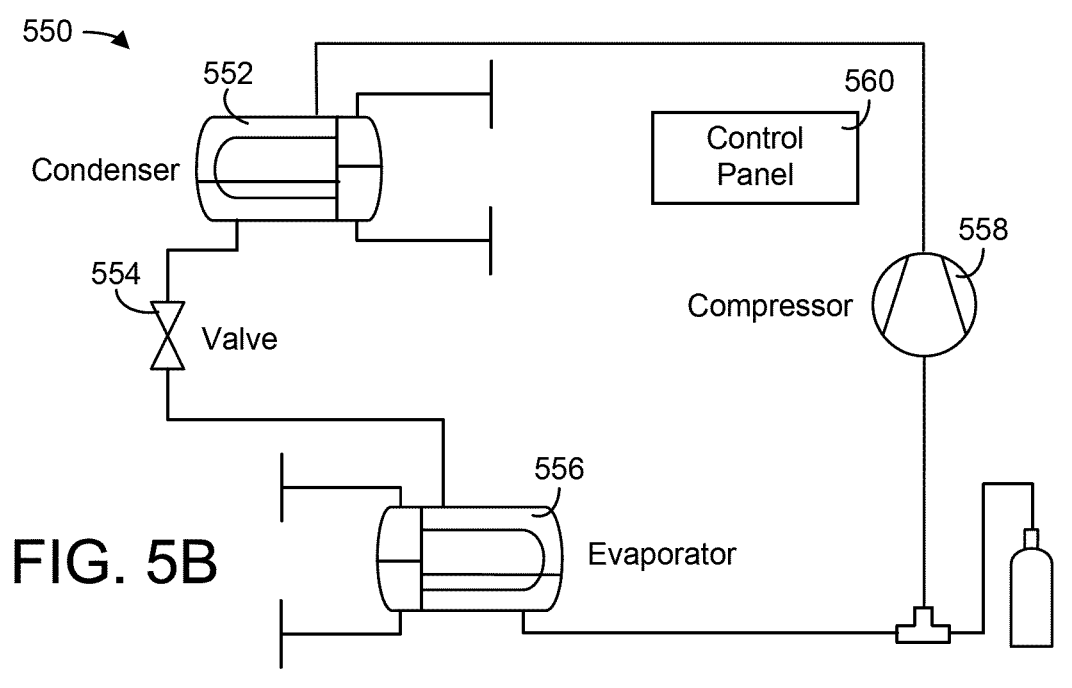

Referring now to FIG. 5B, a schematic diagram of a centrifugal chiller 550 is shown, according to some embodiments. Chiller 550 may be a chiller C1 or a chiller C2 of FIG. 5A. Chiller 550 is shown to include a refrigeration circuit having a condenser 552, an expansion valve 554, an evaporator 556, a compressor 558, and a control panel 560. In some embodiments, chiller 550 includes sensors that measure a set of variables at various locations along the refrigeration circuit. Table 1 below describes an exemplary set of variables that can be measured in chiller 550.

TABLE 1

Chiller Variables

| Number | ID | Description | Units |
|---|---|---|---|
| 1 | $F_{cw}$ | Condenser water flow rate | kg/s |
| 2 | $F_r$ | Refrigerant charge | kg |
| 3 | $F_{ew}$ | Evaporator water flow rate | kg/s |
| 4 | $T_{cir}$ | Condenser inlet refrigerant temperature | K |
| 5 | $A_v$ | Valve position | $m^2$ |
| 6 | $P_e$ | Evaporator pressure | Pa |
| 7 | $P_c$ | Condenser pressure | Pa |
| 8 | $W_{com}$ | Compressor power | Watts |
| 9 | $T_{eow}$ | Evaporator outlet water temperature | K |
| 10 | $T_{cow}$ | Condenser outlet water temperature | K |
| 11 | $T_{eiw}$ | Evaporator inlet water temperature | K |
| 12 | $T_{ciw}$ | Condenser inlet water temperature | K |
| 13 | $T_{eor}$ | Evaporator outlet refrigerant temperature | K |
| 14 | $T_{cor}$ | Condenser outlet refrigerant temperature | K |
| 15 | $T_{eir}$ | Evaporator inlet refrigerant temperature | K |

Chiller 550 can be configured to operate in multiple different operating states. For example, chiller 550 can be operated in a low load state, a medium load state, and a high load state. These three states represent the normal operating states or conditions of chiller 550. The evaporator inlet water temperature $T_{eiw}$ can be different in the normal operating states. For example, the value for $T_{eiw}$ may have a first value in the low load state (e.g., 280K), a second value in the medium load state (e.g., 282K), and a third value in the high load state (e.g., 284K).

In one aspect, the arrangement of HVAC devices of the HVAC system is analogous to a schematic arrangement of electronic circuits. Hence, the arrangement of the HVAC devices of the HVAC system can be represented by a netlist of a schematic representation of components. Such netlist or the arrangement of the HVAC devices may be employed by the state predictor 470 to distribute a target load, predict thermodynamic states according to the distributed load, and estimate power consumption of the HVAC devices operating according to the predicted thermodynamic states.

In one approach, in response to Q allocation data 442 indicating a target load (e.g., target thermal energy load) of the branch 500 of the HVAC system, the target load is evenly distributed between to chillers. However, distributing the target load between the two chillers C1, C2 may not render a power efficient solution. For example, operating each of two chillers C1, C2 at 30% capacity may consume more power than operating the first chiller C1 at 60% (or higher than 60%) and turning off the second chiller C2. The low level optimizer 450 may distribute the target load unevenly to determine set points of the chillers C1, C2 rendering lower power consumption than a power consumption of the chillers C1, C2 operating according to set points for even distribution of the target load. Additional examples of distributing load of HVAC system are provided below with respect to FIGS. 6-10.

Figure 5C:
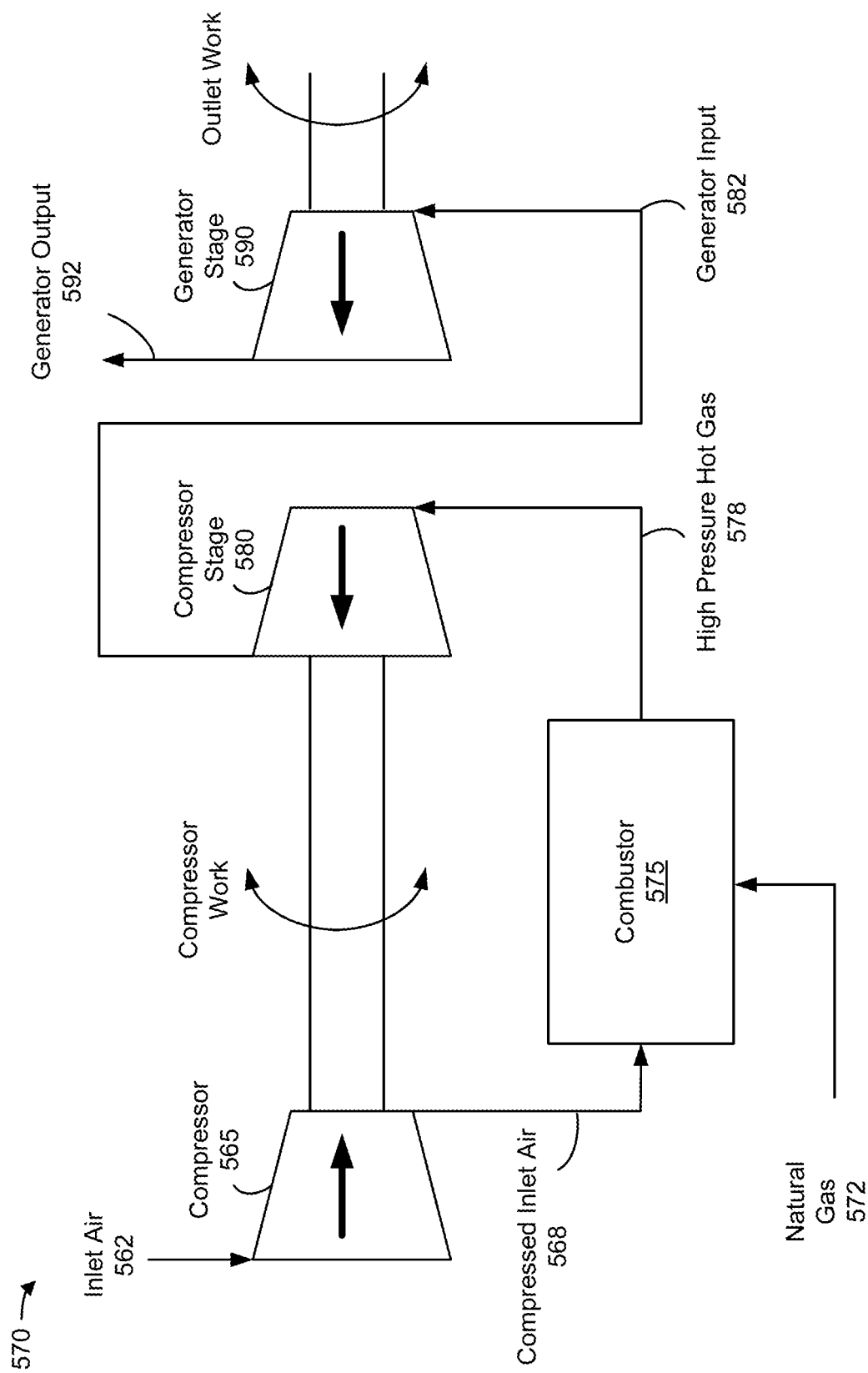
FIG. 5C is a schematic diagram of combustion turbine, according to some embodiments.

Referring FIG. 5C, illustrated is a schematic diagram of a combustion turbine 570, according to some embodiments. The combustion turbine 570 may be an HVAC device. In one aspect, the combustion turbine 570 includes a compressor 565, a compressor stage 580, a combustor 575, and a generator stage 590. In one configuration, the compressor 565 receives inlet air 562 and outputs a compressed inlet air 568. The combustor 575 receives the compressed inlet air 568 and natural gas 572, and outputs high pressure hot gas 578 to the compressor stage 580 according to the natural gas 572. The compressor stage 580 receives the high pressure hot gas 578, and outputs generator input 582 according to the hot pressure hot gas 578. The generator stage 590 receives the generator input 582, and outputs a generator output 592. In some embodiments, two or more combustion turbines 570 may be connected together. By modeling each combustion turbine 570 as shown in FIG. 5C and obtaining variables such as temperature and mass of inlet air 562 and generator output 592, etc., energy (e.g., outlet work) may be distributed to different combustion turbines 570 in a manner that minimizes the amount of total natural gas 572 consumed, as described in detail below with respect to FIG. 6.

Figure 6:
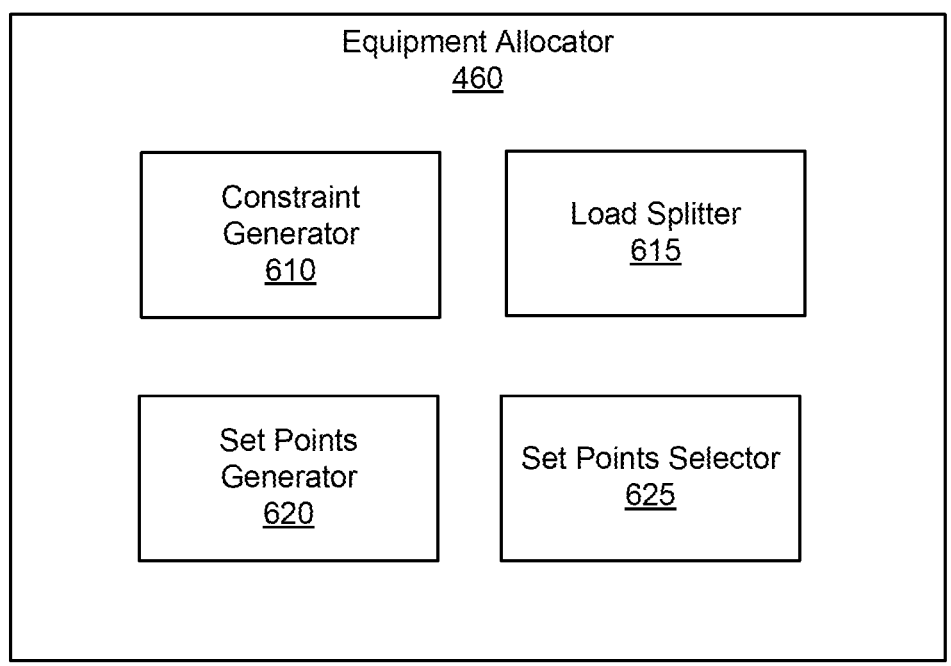
FIG. 6 is a block diagram of an equipment allocator of FIG. 4, according to some embodiments.

Referring to FIG. 6, illustrated is a block diagram of the equipment allocator 460 of FIG. 4, according to some embodiments. In some embodiments, the equipment allocator 460 includes a constraint generator 610, a load splitter 615, a set points generator 620, and a set points selector 625. These components operate together to receive a target load, and determine set points of HVAC devices to satisfy the target load with a reduced power efficiency. In one approach, these components split the target load unevenly to different HVAC devices in a common branch to determine set points of HVAC devices rendering a power efficient solution. In some embodiments, the state predictor 470 includes different, fewer, or additional components than shown in FIG. 6.

The constraint generator 610 is a component that determines constraints of HVAC devices in a branch. The constraint generator 610 may identify HVAC devices in a common branch based on netlist data electronically indicating schematic arrangement of the HVAC devices. Moreover, the constraint generator 610 may generate constraint data indicating operating constraints of the HVAC devices such as a maximum operating load, a minimum operating load, operable load level, etc. A maximum operating load of an HVAC device is a largest capacity of the HVAC device. A minimum operating load of an HVAC device is a lowest capacity of the HVAC device in operation before being turned off. For example, an HVAC device has a minimum operating load (e.g., 5%) before being turned off. The constraint generator 610 may generate the constraint data for HVAC devices in the common branch and provide the constraint data to the load splitter 615.

In one approach, the constraint generator 610 obtains a power function of a HVAC device (e.g., chiller) in a branch. By implementing a GordonNg model, following power equation can be obtained:

$$P = Cx + d \quad \text{Eq. (4)}$$

$$C = \text{Coeff}(3)\rho C_p F_{cw}(Tcow-Tciw)/Teow-Tcow/Teow-1 \quad \text{Eq. (5)}$$

$$d = \text{Coeff}(1)*TcOut + \text{Coeff}(2)*(Tcow/Teow+1) \quad \text{Eq. (6)}$$

where x represents the load allocated (Q) of the chiller; Tcow represents a condenser side leaving water temperature; Tciw represents a condenser side entering water temperature; Teow represents a evaporator side leaving water temperature; and Fcw represents a flow condenser water side. This power function can be implemented through a method on the model classes that outputs its power function vector to be concatenated with the rest of the power model vectors created in mixed-integer linear program (MILP).

In addition, the constraint generator 610 may create the constraints on the two different model classes' constructors such that they could be accessed and used generically in the MILP at the appropriate time. This may be accomplished by having separate single and/or dual compressor model types for GordonNg. Constraint matrices may be created such that per each chiller type they could be accessed and concatenated to generically produce the constraints to the MILP. For example, a chiller may be a single compressor type or a dual compressor type. The chiller with the single compressor type may be turned on or off, where the chiller with the dual compressor type may operate in a low mode or a high mode. For a single compressor type, the constraint generator 610 may obtain the following GordonNg Chiller Model constraints:

$$X1 - X2*CAP \leq 0 \quad \text{Eq. (7)}$$

$$X2*MTD - X1 \leq 0 \quad \text{Eq. (8)}$$

where MTD represents minimum turn down (or minimum operating load) of chiller; CAP represents maximum capacity (or maximum operating load) of a HVAC device (e.g., chiller); X1 represents Q (load) of the HVAC device; and X2 represents on/off status of the HVAC device. For a dual compressor type, the constraint generator 610 obtains the following GordonNg Chiller Model constraints:

$$X3 + X4 - X5 = 0 \quad \text{Eq. (9)}$$

$$X1 - X3*SP \leq 0 \quad \text{Eq. (10)}$$

$$X2 - X4*CAP \leq 0 \quad \text{Eq. (11)}$$

$$X3*MTD - X1 \leq 0 \quad \text{Eq. (12)}$$

$$X4*SP - X2 \leq 0 \quad \text{Eq. (13)}$$

where X1 represents a low Q assigned of a HVAC device; X2 represents a high Q assigned of the HVAC device; X3 represents a low mode binary of the HVAC device; X4 represents a high mode binary of the HVAC device; X5 represents on/off status of the HVAC device (binary); and SP represents a load value switch point between single and dual compressor stages.

In one approach, the constraint generator 610 represents which constraints are the binary constraints in a vector format. For example, for a single compressor mode, an integer vector [0,1] may indicate only X2 is binary. For another example, for a dual compressor mode, integer vector [0,0,1,1,1] may indicate only X3, X4, and X5 are binary. By knowing which constraints are non-linear, binary constraints can be bound by setting their upper and lower bounds, while leaving the linear constraints bound between negative infinity and positive infinity.

Moreover, the constraint generator 610 ensures that a sum of the linear constraints (or the load allocations) is at least the target load.

The load splitter 615 is a component that receives a target load of a branch of HVAC devices, and splits the loads among the HVAC devices in the branch. The load splitter 615 may obtain the target load of the branch from the Q allocation data 442. Moreover, the load splitter 615 may generate load distribution data electronically indicating a list of different sets of load distributions. The load splitter 615 may receive the constraint data from the constraint generator 610, and obtain different sets of load distributions according to various constraints of different HVAC devices. For example, a first set of distribution may indicate that 100% of target load is allocated to a first HVAC device, and 0% of the target load is allocated to a second HVAC device, such that the total load of the first HVAC device and the second HVAC device satisfies the target load (100%). In addition, a second set of distribution may indicate that 90% of target load is allocated to a first HVAC device, and 10% of the target load is allocated to a second HVAC device. In some examples, the total load of the first HVAC device and the second HVAC device may exceed the target load. For example, a minimum operating load of the second HVAC device may be 15% of the target load, where a first HVAC device is operable at either 80% of the target load or 90% of the target load. In this example, the load splitter 615 may split the load such that 90% of the target load is allocated to the first HVAC device and 15% of the target load is allocated to the second HVAC device. The load splitter 615 generates the load distribution data indicating various sets of load distributions of the HVAC devices in a common branch, and provides the load distribution data to the set points generator 620.

The set points generator 620 is a component that receives the load distribution data from the load splitter 615, and determines different operating parameters of the HVAC devices in a common branch. In one approach, the set points generator 620 determines, for a set of load distribution, a corresponding combination of set points of HVAC devices. For example, if a distribution indicates that 40% of the target load is assigned to a first HVAC device and 60% of the target load is assigned to a second HVAC device, the set points generator 620 determines set points of the first device rendering 40% of the target load (or close to 40%) and determines set points of the second device rendering 60% of the target load (or close to 60%). The set points generator 620 may determine set points for a given load of HVAC device based on mapping table. The set points generator 620 may generate the candidate operating parameter data 462 specifying determined combination of set points of the HVAC devices in a branch, and provide the candidate operating parameter data 462 to the state predictor 470.

The set points selector 625 is a component that selects a combination of set points of HVAC devices rendering lower power consumption. The set points selector 625 may receive, from the power estimator 480, power estimation data 482 of HVAC devices operating according to different combinations of set points, and select a combination of set points rendering lower power consumption. The set points selector 625 may obtain power consumptions of HVAC devices operating according to various combinations of set points of HVAC devices, and determine a combination of set points rendering the lowest power consumption. Alternatively, the set points selector 625 may compare power consumptions of HVAC devices through a binary search sequence. The set points selector 625 generates the operating parameter & power estimation data 448 indicating the selected combination of set points of HVAC devices in a branch and associated power consumption. The set points selector 625 may provide, to the high level optimizer 440, the operating parameter & power estimation data 448, based on which the HVAC system can be operated.

In some embodiments, the equipment allocator 460 distributes an amount of energy W supplied to different turbine stages in a manner that reduces total gas consumed. The equipment allocator 460 may operate in a similar manner as described above with respect to a chiller.

In one approach, the constraint generator 610 generates following constraints for each combustion turbine:

$$m_{gas} = m_{in} c_p (T_7 - T_1)/(\text{HHV} \eta_{th} \eta_{Isentropic}^2 - c_p T_7) \quad \text{Eq. (14)}$$

$$T_7 = f(W, T_1) \quad \text{Eq. (15)}$$

$$\min = f(W, T_1) \quad \text{Eq. (16)}$$

where $m_{gas}$ represents mass of natural gas 572; $m_{in}$ represents mass of inlet air 562, $c_p$ is average heat of air; $T_7$ is a temperature of the generator output 592; $T_1$ is a temperature of inlet air 562; HHV is higher heating value of natural gas; $\eta_{th}$ is a threshold efficiency, and $\eta_{Isentropic}$ is an efficiency; and W is energy allocated to the turbine (outlet work). Unlike the chiller model, the model for the combustion turbine is non-linear. Thus, the set points selector 625 may apply the nonlinear least squares to minimize the total gas consumption to select the set points, rather than applying a mixed integer approach and a linear matrix approach for the chiller.

Figure 7:
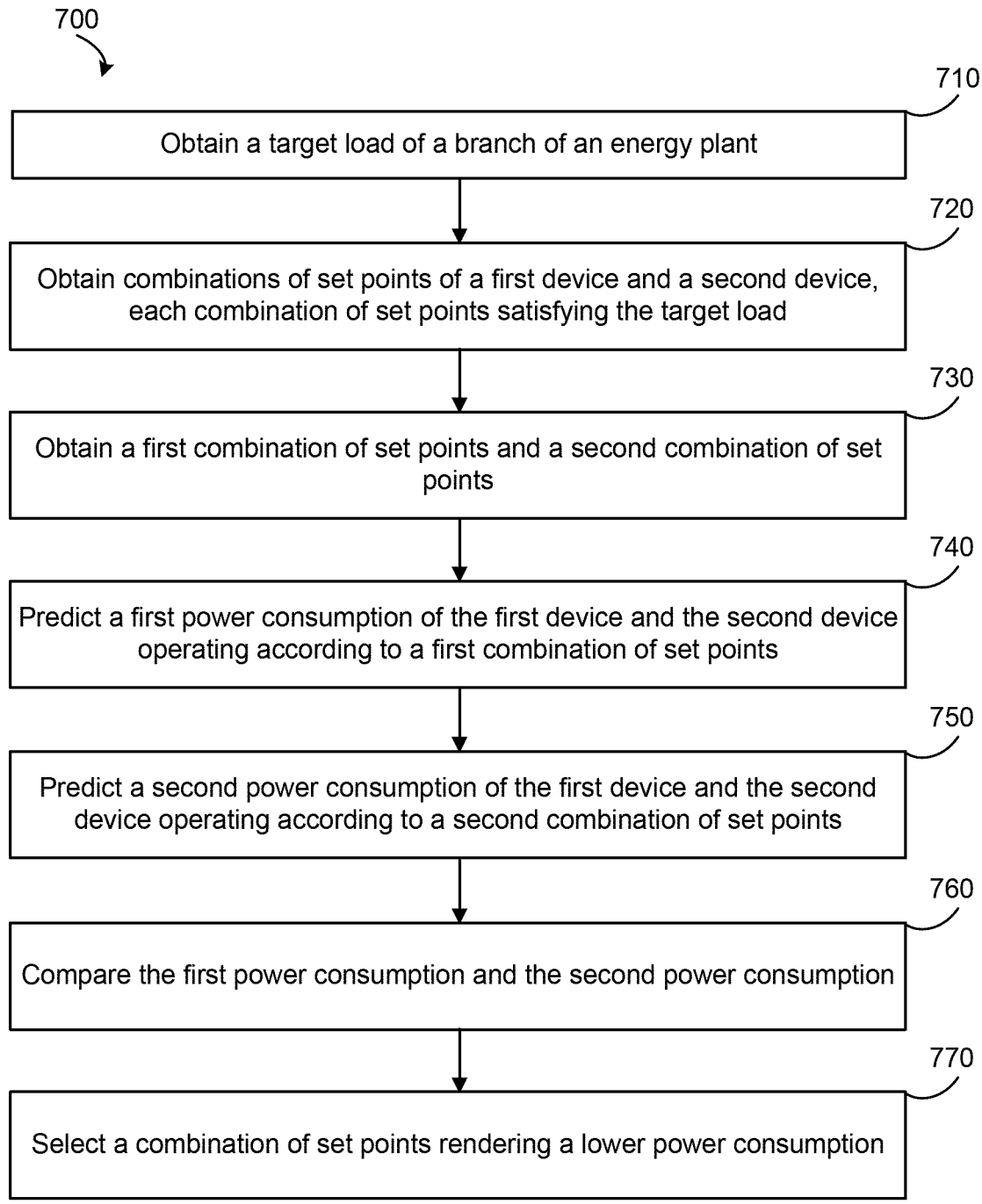
FIG. 7 is a flow chart illustrating a process for distributing load of HVAC system, according to some embodiments.

Referring to FIG. 7, illustrated is a flow chart illustrating a process 700 for distributing load of HVAC system, according to some embodiments. The process 700 may be performed by the low level optimizer 450 of FIG. 4. In some embodiments, the process 700 may be performed by other entities. In some embodiments, the process 700 may include additional, fewer, or different steps than shown in FIG. 7.

The low level optimizer 450 obtains a target load of a branch of an energy plant (step 710). The low level optimizer 450 may obtain the target load from the high level optimizer 440. In one approach, the target load of a branch of HVAC devices are specified in the Q allocation data 442. The branch of the energy plant may include at least a first device and a second device. The first device and the second device may be coupled to each other in parallel as shown in FIG. 5A. The first device and the second device may be identical devices or different devices.

The low level optimizer 450 obtains combinations of set points of a first device and a second device (step 720). The low level optimizer 450 may determine constraints of the first device and the second device. For example, the low level optimizer 450 determines minimum operating loads, maximum operating loads, or constraint models as shown in Eq. (7)-Eq. (13). The low level optimizer 450 may generate load distribution data indicating a list of various load distributions to distribute the target load to the first device and the second device. In one aspect, the load distributed to the first device and the load distributed to the second device are different.

The low level optimizer 450 obtains a first combination of set points and a second combination of set points (step 730). The low level optimizer 450 may determine the first combination of set points for a distribution of the target load specifying a first load of the first device and a second load of the second device. The first combination of set points includes first set points of the first device satisfying the first load and second set points of the second device satisfying the second load. Similarly, the low level optimizer 450 may determine the second combination of set points for another distribution of the target load specifying a third load of the first device and a fourth load of the second device. The second combination of set points includes third set points of the first device satisfying the third load and fourth set points of the second device satisfying the fourth load.

The low level optimizer 450 predicts a first power consumption of the first device and the second device operating according to a first combination of set points (step 740). The low level optimizer 450 predicts a second power consumption of the first device and the second device operating according to a second combination of set points (step 750). The low level optimizer 450 may predict first thermodynamic states of HVAC devices operating according to the first combination of set points and predict the first power consumption of the first device and the second device according to the first thermodynamic states. Similarly, the low level optimizer 450 may predict second thermodynamic states of HVAC devices operating according to the second combination of set points, and predict the first power consumption of the first device and the second device based on the second thermodynamic states. The low level optimizer 450 compares the first power consumption and the second power consumption (step 760). The low level optimizer 450 selects a combination of set points rendering lower power consumption (step 770). The low level optimizer 450 may repeat the process 700 to identify a combination of set points of the first device and the second device rendering a lower power consumption.

Although the process 700 illustrated in FIG. 7 is performed for two devices, the process 700 may be performed on any number of devices. Moreover, power consumption of two or more devices operating under multiple combinations of set points may be predicted and compared, and a combination of set points rendering a lowest power consumption may be selected. Hence, the device may operate in a power efficient manner.

Figure 8B:
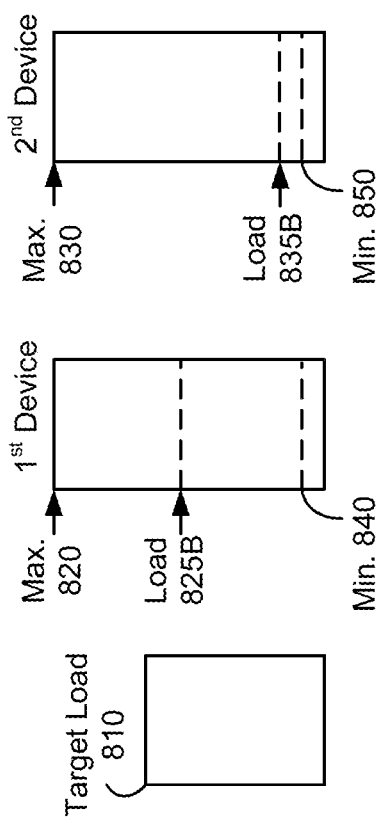
FIGS. 8A-8D are examples of distributing a target load between a first device and a second device, according to some embodiments.
Figure 8D:
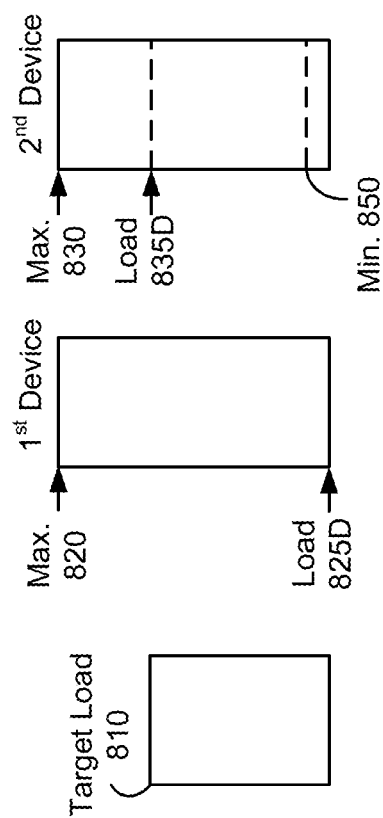
Figure 8A:
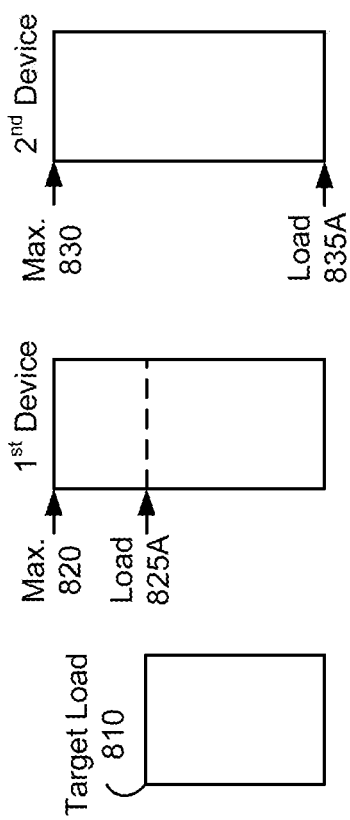
Figure 8C:
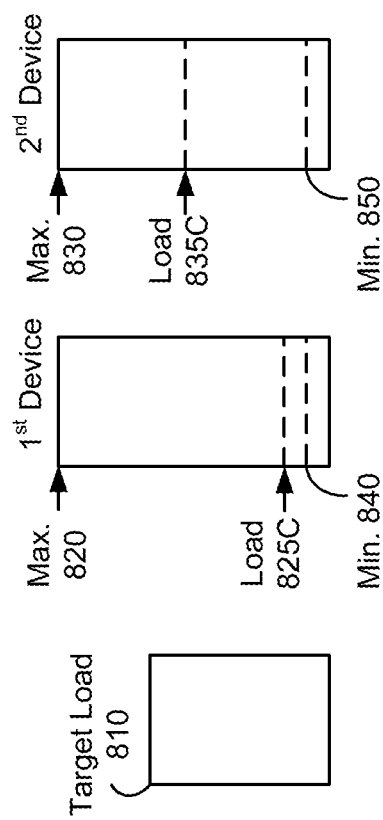

Referring to FIGS. 8A-8D illustrated are examples of distributing a target load 810 between a first device and a second device, according to some embodiments. Specifically, FIG. 8A illustrates a first load distribution of a target load 810 between the first device and the second device; FIG. 8B illustrates a second load distribution of the target load 810 between the first device and the second device; FIG. 8C illustrates a third load distribution of the target load 810 between the first device and the second device; and FIG. 8D illustrates a fourth load distribution of the target load 810 between the first device and the second device.

In the examples shown in FIGS. 8A-8D, the target load 810 is less than each of maximum operating loads 820, 830 of the first device and the second device. When the target load 810 is less than each of the maximum operating loads 820, 830 of the first device and the second device, the low level optimizer 450 may obtain a distribution of the target load 810 as shown in FIG. 8A, where the first device is assigned to the entire load 825A, and the second device is assigned to a zero load. Similarly, the low level optimizer 450 may obtain a different distribution of the target load 810 as shown in FIG. 8D, where the second device is assigned to the entire load 835D, and the first device is assigned to a zero load. When a device is assigned to a zero load, the device may be turned off during operation. The low level optimizer 450 may also obtain a different distribution of the target load 810 as shown in FIG. 8B, where the first device is assigned to the load 825B and the second device is assigned to the load 835B less than the load 825B. Similarly, the low level optimizer 450 may also obtain a different distribution of the target load 810 as shown in FIG. 8C, where the first device is assigned to the load 825C and the second device is assigned to the load 835C larger than the load 825C. The low level optimizer 450 may distribute the target load 810 such that the sum of the load 825 assigned to the first device and the load 835 assigned to the second device is at least the target load 810. The low level optimizer 450 may also distribute the target load 810 such that the load 825 distributed to the first device is a zero load or at least a minimum operating load 840 of the first device and the load 835 distributed to the second device is a zero load or at least a minimum operating load 850 of the second device. By comparing predicted power consumptions according to distributions of the target load 810 as shown in FIGS. 8A-8D rather than evenly distributing a load between two devices, a distribution of the target load rendering a power efficiency can be determined.

Referring to FIGS. 9A-9D illustrated are examples of distributing a target load 910 between a first device and a second device, according to some embodiments. Specifically, FIG. 9A illustrates a first load distribution of the target load 910 between the first device and the second device; FIG. 9B illustrates a second load distribution of the target load 910 between the first device and the second device; FIG. 9C illustrates a third load distribution of the target load 910 between the first device and the second device; and FIG. 9D illustrates a fourth load distribution of the target load 910 between the first device and the second device.

In the examples shown in FIGS. 9A-9D, the target load 910 is larger than each of maximum operating loads 920, 930 of the first device and the second device. When the target load 910 is larger than each of the maximum operating loads 920, 930 of the first device and the second device, the low level optimizer 450 may obtain a distribution of the target load 910 as shown in FIG. 9A, where the first device is assigned to the load 925A corresponding to the maximum operating load 920 of the first device, and the second device is assigned to a remaining load 935A. Similarly, the low level optimizer 450 may obtain a distribution of the target load 910 as shown in FIG. 9D, where the second device is assigned to the load 935D corresponding to the maximum operating load 930 of the second device, and the first device is assigned to a load 925D. The low level optimizer 450 may also obtain a different distribution of the target load 910 as shown in FIG. 9B, where the first device is assigned to the load 925B and the second device is assigned to the load 935B less than the load 925B. Similarly, the low level optimizer 450 may also obtain a different distribution of the target load 910 as shown in FIG. 9C, where the first device is assigned to the load 925C and the second device is assigned to the load 935C larger than the load 925C. The low level optimizer 450 may distribute the target load 910 such that the sum of the load 925 assigned to the first device and the load 935 assigned to the second device is at least the target load 910. The low level optimizer 450 may also distribute the target load 910 such that the load 925 distributed to the first device is at least a minimum operating load 940 of the first device and the load 935 distributed to the second device is at least a minimum operating load 950 of the second device. By comparing predicted power consumptions according to distributions of the target load 910 as shown in FIGS. 9A-9D rather than evenly distributing a load between two devices, a distribution of the target load rendering a power efficiency can be determined.

Figure 10A:
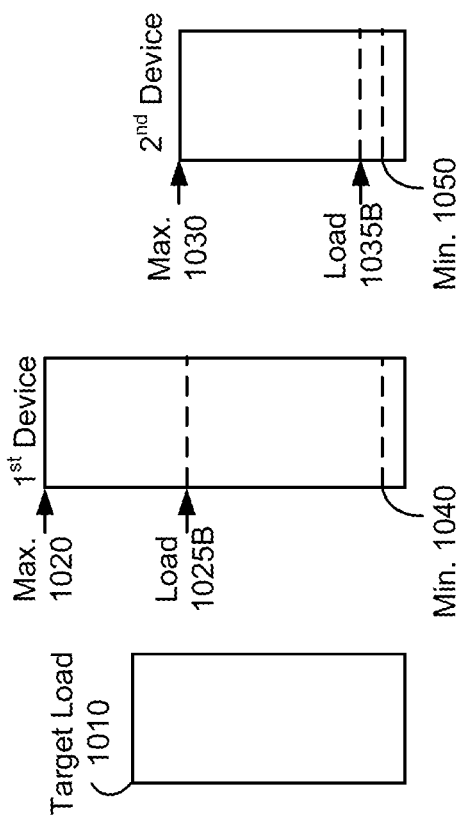
FIGS. 10A-10D are examples of distributing a target load between a first device and a second device, according to some embodiments.
Figure 10B:
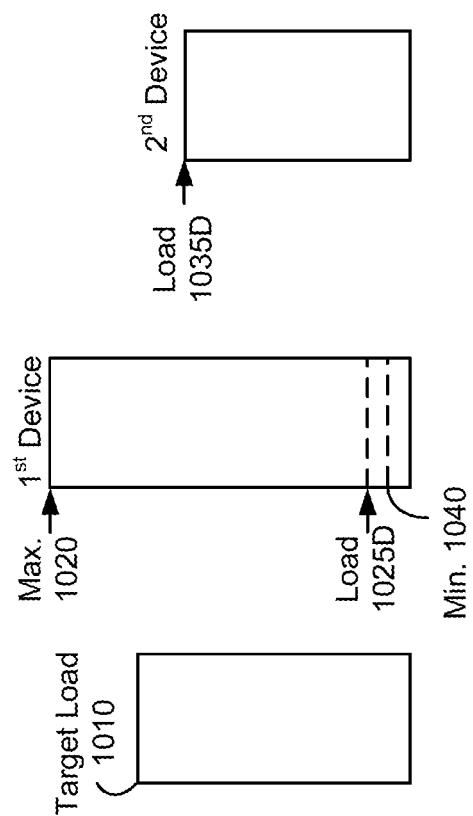
Figure 10C:
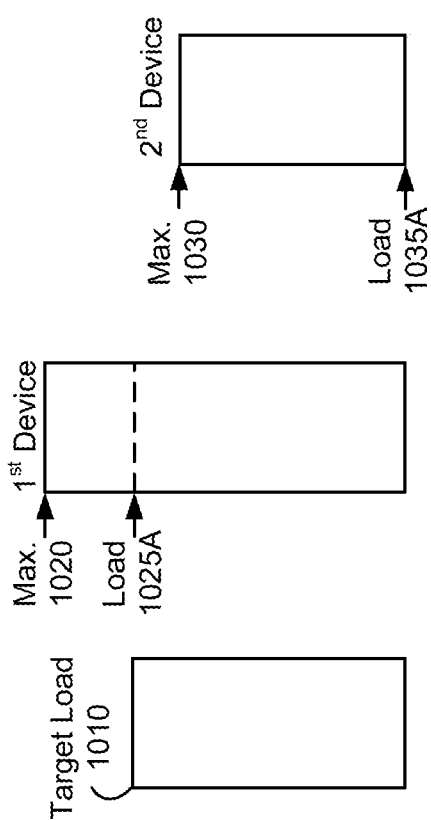
Figure 10D:
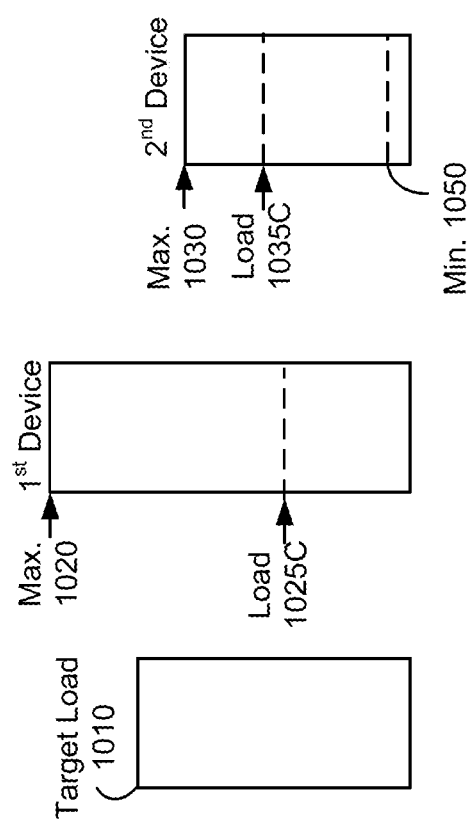

Referring to FIGS. 10A-10D illustrated are examples of distributing a target load 1010 between a first device and a second device, according to some embodiments. Specifically, FIG. 10A illustrates a first load distribution of the target load 1010 between the first device and the second device; FIG. 10B illustrates a second load distribution of the target load 1010 between the first device and the second device; FIG. 10C illustrates a third load distribution of the target load 1010 between the first device and the second device; and FIG. 10D illustrates a fourth load distribution of the target load 1010 between the first device and the second device.

In the examples shown in FIGS. 10A-10D, the target load 1010 is less than a maximum operating load 1020 of the first device, and is larger than a maximum operating load 1030 of the second device. When the target load 910 is less than the maximum operating load 1020 of the first device and larger than the maximum operating load 1030 of the second device, the low level optimizer 450 may obtain a distribution of the target load 1010 as shown in FIG. 10A, where the first device is assigned to the entire load 1025A, and the second device is assigned to a zero load 1035A. If the target load 910 is less than the maximum operating load 1020 of the first device and larger than the maximum operating load 1030 of the second device as shown in FIG. 10A, the low level optimizer 450 may assign the entire load 1025A to the first device as a default. The low level optimizer 450 may also obtain a distribution of the target load 1010 as shown in FIG. 10D, where the second device is assigned to the load 1035D corresponding to the maximum operating load 1030 of the second device, and the first device is assigned to a remaining load 1025D. The low level optimizer 450 may also obtain a different distribution of the target load 1010 as shown in FIG. 10B, where the first device is assigned to the load 1025B and the second device is assigned to the load 1035B less than the load 1025B. Similarly, the low level optimizer 450 may also obtain a different distribution of the target load 1010 as shown in FIG. 10C, where the first device is assigned to the load 1025C and the second device is assigned to the load 1035C larger than the load 1025C. The low level optimizer 450 may distribute the target load 1010 such that the sum of the load 1025 assigned to the first device and the load 1035 assigned to the second device is at least the target load 1010. The low level optimizer 450 may also distribute the target load 1010 such that the load 1025 distributed to the first device is at least a minimum operating load 1040 of the first device and the load 1035 distributed to the second device is a zero load or at least a minimum operating load 1050 of the second device. By comparing predicted power consumptions according to distributions of the target load 1010 as shown in FIGS. 10A-10D rather than evenly distributing a load between two devices, a distribution of the target load rendering a power efficiency can be determined.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can include RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A controller for an energy plant, the controller comprising:
   a processing circuit comprising a processor and memory storing instructions executed by the processor, the processing circuit configured to:
   obtain a target load of a branch of the energy plant, the branch including at least a first device and a second device coupled to each other in parallel,
   distribute the target load of the branch across at least the first device and the second device according to multiple different sets of load distributions comprising a first set of load distributions and a second set of load distributions;
   adjust the second set of load distributions in response to a determination that the second set of load distributions would cause at least one of the first device or the second device to violate a minimum operating load constraint, wherein adjusting the second set of load distributions causes a combined load of the branch resulting from the second set of load distributions to exceed the target load of the branch;
   predict a first power consumption of the first device and the second device, the first power consumption predicted to result from operating the first device and the second device according to a first combination of set points to satisfy the first set of load distributions, the first combination of set points including first set points of the first device and second set points of the second device,
   predict a second power consumption of the first device and the second device, the second power consumption predicted to result from operating the first device and the second device according to a second combination of set points to satisfy the second set of load distributions, the second combination of set points including third set points of the first device and fourth set points of the second device,
   compare the first power consumption and the second power consumption,
   select, one of the first combination of set points and the second combination of set points according to which combination of set points is predicted to result in lower power consumption based on the comparing, and
   operate the energy plant according to the selected one of the first combination of set points and the second combination of set points.

2. The controller of claim 1, wherein:
   a first load of the first device operating according to the first set points is different from a second load of the second device operating according to the second set points, and
   a third load of the first device operating according to the third set points is different from a fourth load of the second device operating according to the fourth set points.

3. The controller of claim 1, wherein the processing circuit is further configured to:
   enable the first device and disable the second device, according to the selected one of the first combination of set points and the second combination of set points.

4. The controller of claim 1, wherein the processing circuit is further configured to:
   determine whether the target load is less than a maximum operating load of the first device and a maximum operating load of the second device, and
   in response to determining that the target load is less than the maximum operating load of the first device and the maximum operating load of the second device:
   determine the first set points of the first device corresponding to a first load satisfying the target load, and
   determine the second set points of the second device corresponding to a zero load.

5. The controller of claim 4, wherein the processing circuit is further configured to:
   in response to determining that the target load is less than the maximum operating load of the first device and the maximum operating load of the second device:
   determine the third set points of the first device corresponding to a second load less than the first load, and
   determine the fourth set points of the second device corresponding to a third load, a combination of the second load and the third load satisfying the target load, the third load being at least a minimum operating load of the second device.

6. The controller of claim 5, wherein the second load is at least a minimum operating load of the first device.

7. The controller of claim 5, wherein the second load is the zero load.

8. The controller of claim 1, wherein the processing circuit is further configured to:
- determine whether the target load is higher than a maximum operating load of the first device and a maximum operating load of the second device, and
- in response to determining that the target load is higher than the maximum operating load of the first device and the maximum operating load of the second device:
  - determine the first set points of the first device corresponding to a minimum operating load of the first device, and
  - determine the second set points of the second device corresponding to a first load, a combination of the minimum operating load of the first device and the first load satisfying the target load.

9. The controller of claim 8, wherein the processing circuit is further configured to:
- in response to determining that the target load is higher than the maximum operating load of the first device and the maximum operating load of the second device:
  - determine the third set points of the first device corresponding to a second load higher than the minimum operating load of the first device, and
  - determine the fourth set points of the second device corresponding to a third load, the third load less than the first load, a combination of the second load and the third load satisfying the target load, the third load being at least a minimum operating load of the second device.

10. The controller of claim 1, wherein the processing circuit is further configured to:
- determine whether the target load is less than a maximum operating load of the first device and is higher than a maximum operating load of the second device,
- in response to determining that the target load is less than the maximum operating load of the first device and is higher than the maximum operating load of the second device:
  - determine the first set points of the first device corresponding to a first load satisfying the target load, and
  - determine the second set points of the second device corresponding to a zero load.

11. The controller of claim 10, wherein the processing circuit is further configured to:
- in response to determining that the target load is less than the maximum operating load of the first device and is higher than the maximum operating load of the second device:
  - determine the third set points of the first device corresponding to a second load less than the first load, the second load being at least a minimum operating load of the first device, and
  - determine the fourth set points of the second device corresponding to a third load, a combination of the second load and the third load satisfying the target load, the third load being at least a minimum operating load of the second device.

12. A non-transitory computer readable medium storing instructions to operate an energy plant, the instructions when executed by one or more processors cause the one or more processors to:
- obtain a target load of a branch of the energy plant, the branch including at least a first device and a second device coupled to each other in parallel,
- distribute the target load of the branch across at least the first device and the second device according to multiple different sets of load distributions comprising a first set of load distributions and a second set of load distributions,
- adjust the second set of load distributions in response to a determination that the second set of load distributions would cause at least one of the first device or the second device to violate a minimum operating load constraint, wherein adjusting the second set of load distributions causes a combined load of the branch resulting from the second set of load distributions to exceed the target load of the branch,
- predict a first power consumption of the first device and the second device, the first power consumption predicted to result from operating the first device and the second device according to a first combination of set points to satisfy the first set of load distributions, the first combination of set points including first set points of the first device and second set points of the second device,
- predict a second power consumption of the first device and the second device, the second power consumption predicted to result from operating the first device and the second device according to a second combination of set points to satisfy the second set of load distributions, the second combination of set points including third set points of the first device and fourth set points of the second device,
- compare the first power consumption and the second power consumption,
- select, one of the first combination of set points and the second combination of set points according to which combination of set points is predicted to result in lower power consumption based on the comparing, and
- operate the energy plant according to the selected one of the first combination of set points and the second combination of set points.

13. The non-transitory computer readable medium of claim 12, wherein:
- a first load of the first device operating according to the first set points is different from a second load of the second device operating according to the second set points, and
- a third load of the first device operating according to the third set points is different from a fourth load of the second device operating according to the fourth set points.

14. The non-transitory computer readable medium of claim 12, wherein the instructions when executed by the one or more processors cause the one or more processors to:
- enable the first device and disable the second device, according to the selected one of the first combination of set points and the second combination of set points.

15. The non-transitory computer readable medium of claim 12, wherein the instructions when executed by the one or more processors cause the one or more processors to:
- determine whether the target load is less than a maximum operating load of the first device and a maximum operating load of the second device, and
- in response to determining that the target load is less than the maximum operating load of the first device and the maximum operating load of the second device:
  - determine the first set points of the first device corresponding to a first load satisfying the target load, and
  - determine the second set points of the second device corresponding to a zero load.

16. The non-transitory computer readable medium of claim 15, wherein the instructions when executed by the one or more processors cause the one or more processors to:
in response to determining that the target load is less than the maximum operating load of the first device and the maximum operating load of the second device:
determine the third set points of the first device corresponding to a second load less than the first load, and
determine the fourth set points of the second device corresponding to a third load, a combination of the second load and the third load satisfying the target load, the third load being at least a minimum operating load of the second device.

17. The non-transitory computer readable medium of claim 16, wherein the second load is at least a minimum operating load of the first device.

18. The non-transitory computer readable medium of claim 16, wherein the second load is the zero load.

19. The non-transitory computer readable medium of claim 12, wherein the instructions when executed by the one or more processors cause the one or more processors to:
determine whether the target load is higher than a maximum operating load of the first device and a maximum operating load of the second device, and
in response to determining that the target load is higher than the maximum operating load of the first device and the maximum operating load of the second device:
determine the first set points of the first device corresponding to a minimum operating load of the first device,
determine the second set points of the second device corresponding to a first load, a combination of the minimum operating load of the first device and the first load satisfying the target load,
determine the third set points of the first device corresponding to a second load higher than the minimum operating load of the first device, and
determine the fourth set points of the second device corresponding to a third load, the third load less than the first load, a combination of the second load and the third load satisfying the target load, the third load being at least a minimum operating load of the second device.

20. The non-transitory computer readable medium of claim 12, wherein the instructions when executed by the one or more processors cause the one or more processors to:
determine whether the target load is less than a maximum operating load of the first device and is higher than a maximum operating load of the second device,
in response to determining that the target load is less than the maximum operating load of the first device and is higher than the maximum operating load of the second device:
determine the first set points of the first device corresponding to a first load satisfying the target load,
determine the second set points of the second device corresponding to a zero load,
determine the third set points of the first device corresponding to a second load less than the first load, the second load being at least a minimum operating load of the first device, and
determine the fourth set points of the second device corresponding to a third load, a combination of the second load and the third load satisfying the target load, the third load being at least a minimum operating load of the second device.

* * * * *